(12) United States Patent
Suzuki

(10) Patent No.: US 12,159,679 B2
(45) Date of Patent: Dec. 3, 2024

(54) NON-VOLATILE SEMICONDUCTOR STORAGE DEVICE

(71) Applicant: RENESAS ELECTRONICS CORPORATION, Tokyo (JP)

(72) Inventor: Junichi Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 177 days.

(21) Appl. No.: 17/993,444

(22) Filed: Nov. 23, 2022

(65) Prior Publication Data
US 2023/0197171 A1 Jun. 22, 2023

(30) Foreign Application Priority Data
Dec. 22, 2021 (JP) ................. 2021-208252

(51) Int. Cl.
*G11C 16/34* (2006.01)
*G11C 16/14* (2006.01)
*G11C 16/26* (2006.01)

(52) U.S. Cl.
CPC .......... *G11C 16/3445* (2013.01); *G11C 16/14* (2013.01); *G11C 16/26* (2013.01); *G11C 16/34* (2013.01)

(58) Field of Classification Search
CPC .............................. G11C 16/3445; G11C 7/18
See application file for complete search history.

(56) References Cited

U.S. PATENT DOCUMENTS 7,646,642 B2   1/2010  Fujito et al.
2016/0049192 A1*  2/2016  Lee .......................... G11C 7/18
                                                365/185.03

FOREIGN PATENT DOCUMENTS

JP     2008-117510 A    5/2008

* cited by examiner

*Primary Examiner* — Jason Lappas
(74) *Attorney, Agent, or Firm* — Rimon P.C.

(57) ABSTRACT

In each of n twin cells of n first sense amplifier, a current path is formed between a power supply line and one memory cell having a small or large cell current in a data readout state of two memory cells. A second sense amplifier generates erase verify information indicating whether all stored data in the memory cells of the n twin cells are in an erase state at the same level, based on a verify current flowing through a power supply line as a sum of currents of the n first sense amplifiers.

11 Claims, 22 Drawing Sheets

NON-VOLATILE SEMICONDUCTOR STORAGE DEVICE

CROSS-REFERENCE TO RELATED APPLICATION

The disclosure of Japanese Patent Application No. 2021-208252 filed on Dec. 22, 2021, including the specification, drawings and abstract is incorporated herein by reference in its entirety.

BACKGROUND

The present disclosure relates to a non-volatile semiconductor storage device, and, more particularly relates to a non-volatile semiconductor storage device of a complementary readout type.

In a non-volatile semiconductor storage device, data is stored when a current flowing through the memory cell (hereinafter, cell current) varies depending on whether stored data in a memory cell indicates "1" or "0" at the time of data readout. For example, in a flash memory, in a memory cell configured of a MOSFET (Metal Oxide Semiconductor Field Effect Transistor), either one of "1" and "0" can be stored when the threshold voltage of the transistor is changed in accordance with the presence or absence of charge injection to a floating gate.

When stored data in one memory cell is read out, it is possible to apply a scheme (hereinafter, "reference current readout type") of comparing the cell current with a reference current to determine whether the stored data indicates "1" or "0". However, in the reference current readout type, if the cell current is varied due to variations in manufacturing or the like, there is a concern that an erroneous determination may be made on the stored data.

There is disclosed techniques listed below.
[Patent Document 1] Japanese Unexamined Patent Application Publication No. 2008-117510

As a technique for enhancing readout accuracy, a structure of a complementary readout type of complementarily storing "0" and "1" in two memory cells that are paired is described in, for example, Japanese Unexamined Patent Application Publication No. 2008-117510 (Patent Document 1).

The Patent Document 1 describes a structure in which a twin cell is configured of two memory cells for storing binary data based on a difference in a threshold voltage and in which stored data in the twin cell is determined based on a comparison by a sense amplifier in magnitude between cell currents of the two memory cells.

SUMMARY

In general, in a flash memory or the like, data is not directly overwritten in a memory cell in a write state, and data is written in a memory cell in an erase state. Specifically, after an erase operation of setting all of a plurality of memory cells into the erase state (stored data indicates "1") is performed for each block, the write operation is performed on the memory cell in the erase state.

Therefore, at the time of operation of the flash memory, information (hereinafter also referred to as "erase verify information") indicating whether all of a plurality of memory cells included in each predetermined certain section that is a data write target unit are in the erase state is required in order to check whether data is writable in the predetermined certain section.

However, in the flash memory of the complementary readout type, both stored data in two memory cells of each twin cell are the same ("1") in the erase state. Thus, it is difficult to generate the erase verify information by data readout from the twin cell.

Meanwhile, if a memory cell for storing the erase verify information is additionally arranged, particularly in the structure of the complementary readout type requiring memory cells twice as many as the number of storage bits, there is a concern that additional arrangement of many memory cells for storing the erase verify information leads to an increase in size and cost of the device.

The present disclosure is to solve the above-described problem, and provides a non-volatile semiconductor storage device of a complementary readout type capable of generating information indicating whether all of a plurality of memory cells are in an erase state without additional arrangement of memory cells.

Other objects and novel characteristics will be apparent from the description of the present specification and the accompanying drawings.

A non-volatile semiconductor storage device according to one embodiment includes: a plurality of twin cells divided into a plurality of sections; first amplifiers; a second amplifier; and a first power supply line. Each of the plurality of twin cells includes first and second memory cells, a cell current passing in a data readout state of which varies in accordance with binary stored data. Each of the plurality of sections includes n (n: an integer equal to or larger than 2) twin cells. Each of the twin cells is either in an erase state in which the stored data is identical or in a write state in which the stored data is different between the first and second memory cells. The first amplifiers are connected to the n twin cells in parallel. The second amplifier generates erase verify information indicating whether the n twin cells are all in the erase state. Each of the n first amplifiers operates so as to form a current path between the first power supply line and one memory cell having a predetermined smaller or larger cell current of the first and second memory cells set in the data readout state in erase verify operation for generating the erase verify information. The second amplifier generates the erase verify information in the erase verify operation based on a current flowing through the first power supply line.

According to the above-described embodiment, in the non-volatile semiconductor storage device of the complementary readout type, information indicating whether all of the plurality of (n) memory cells are in the erase state can be generated without additional arrangement of memory cells.

BRIEF DESCRIPTIONS OF THE DRAWINGS

DETAILED DESCRIPTION

Hereinafter, each embodiment will be described in detail with reference to the accompanying drawings. Note that the same or similar components are denoted by the same reference signs, and the repetitive description thereof will be omitted.

DESCRIPTION OF COMPARATIVE EXAMPLES

First, comparative examples for generating erase verify information in a non-volatile semiconductor storage device of a complementary readout type are sequentially described. In the following, in the present disclosure, a flash memory is described as a typical example of the non-volatile semiconductor storage device.

Figure 1:
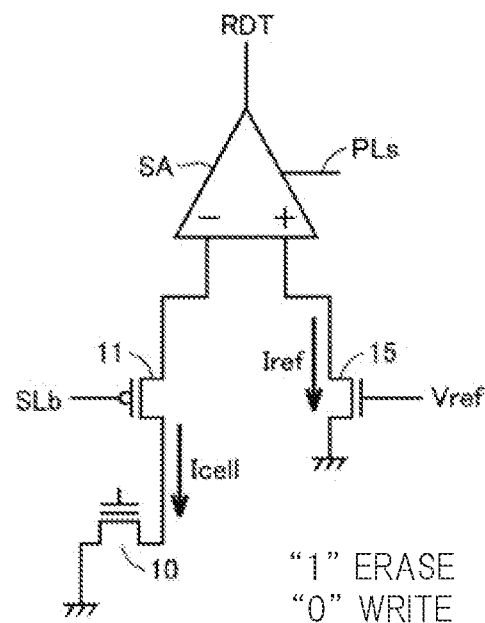
FIG. 1 is a conceptual circuit diagram for describing data readout based on a reference current type of a flash memory.

FIG. 1 is a conceptual circuit diagram for describing the basic data readout principle of the flash memory.

As shown in FIG. 1, in an erase state in which electrical charge is released from a floating gate in a memory cell 10 of the flash memory, the threshold voltage becomes negative, and the stored data indicates "1". On the other hand, when a write operation of injecting electrical charge to the floating gate is performed in the erase state, the memory cell 10 becomes in a write state. In the memory cell 10, the threshold voltage becomes positive in the write state, and the stored data indicates "0". That is, the threshold voltage in the erase state of the memory cell 10 configured of a field effect transistor is lower than the threshold voltage in the write state.

By input of a readout voltage (positive voltage) to the gate, the memory cell 10 as a readout target generates a cell current Icell depending on the threshold voltage. In the same memory cell 10, the cell current Icell in the erase state is larger than the cell current in the write state in which the threshold voltage is increased by the electrical charge injection.

The memory cell 10 is electrically connected to one input node (negative terminal) of a sense amplifier SA through a selector 11 receiving a selection signal SLb input to its gate. The selector 11 is configured of, for example, a P-type MOS transistor. When the selection signal SLb input to the selector 11 corresponding to the memory cell 10 as the readout target is set at "0", the cell current Icell flows to the negative terminal of the sense amplifier SA.

By input of a reference voltage Vref to the gate, a reference cell 15 generates a reference current Iref. The reference cell 15 is connected to the other input node (positive terminal) of the sense amplifier SA. With this, the reference current Iref flows through the positive terminal of the sense amplifier SA.

When receiving supply of power voltage from a power line PLs, the sense amplifier SA outputs readout data RDT indicating the result of comparison in magnitude between the reference current Iref at the positive terminal and the cell current Icell at the negative terminal. In this manner, in the reference current readout scheme, the readout data RDT indicating the stored data of the memory cell 10 can be generated based on the result of comparison between the cell current Icell and the reference current Iref.

In the present disclosure, when the current flowing at the positive terminal (Iref in FIG. 1) is larger than the current flowing at the negative terminal (Icell in FIG. 1), the sensor amplifier SA sets the readout data RDT="0". On the other hand, when the current flowing at the negative terminal (Icell in FIG. 1) is larger than the current flowing at the positive terminal (Iref in FIG. 1), the sensor amplifier SA sets the readout data RDT="1".

Although not shown in the drawing, a plurality of series circuits of memory cells 10 and selectors 11 similar to those shown in the drawing are connected to the one input node (negative terminal) of the sense amplifier SA. The sense amplifier SA and the reference cell 15 (reference current Iref) are shared among the plurality of memory cells 10.

Figure 2:
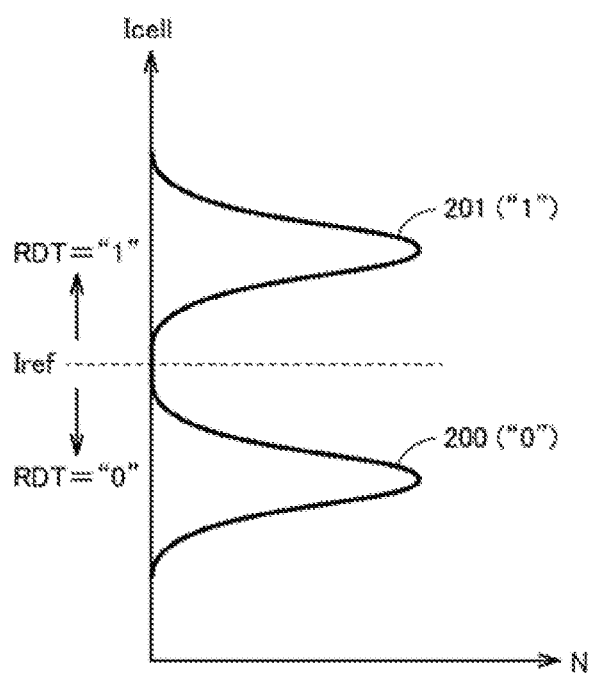
FIG. 2 is a distribution diagram of cell current for describing data readout based on the reference current type of FIG. 1.

FIG. 2 is a distribution diagram of cell current for describing data readout based on the reference current readout type of FIG. 1. FIG. 2 shows a distribution curve 200 of the cell current Icell provided when the stored data in the plurality of memory cells 10 as a whole configuring the non-volatile semiconductor storage device indicates "0" and a distribution curve 201 of the cell current Icell provided when the stored data therein indicates "1".

In the reference current readout type, the reference current Iref needs to be set in a current region where the distribution curves 200 and 201 do not overlap. Thus, when Icell>Iref is detected by the sense amplifier SA, the readout data is set as RDT="1" for the memory cell 10 in the erase state. On the other hand, when Icell<Iref is detected by the sense amplifier SA, the readout data is set as RDT="0" for the memory cell 10 in the write state.

As understood from FIG. 2, if a current region where the distribution curves 200 and 201 overlap is caused by influences such as variations in manufacturing, the stored data is erroneously determined so that the stored data in the memory cell 10 and the readout data RDT do not match in level ("0", "1").

Therefore, a write range and an erase range are determined in relation between a maximum value of the cell current in the distribution curve 200 and a minimum value of the cell current in the distribution curve 201, that is, a current value of the worst bit and the reference current Iref, including degradation, and a limit of reliability in the number of rewritable times and others are determined. For example, in the reference readout type, in order to lead the distribution curve 200 to a sufficiently low current side, it is required to apply voltage to the memory cell 10 so that electrical charge is sufficiently released from the floating gate at the time of erase operation of the memory cell 10. Since this voltage condition is disadvantageous for degradation of the memory cell 10, there is a possibility of the limit of the number of rewritable times.

Figure 3A:
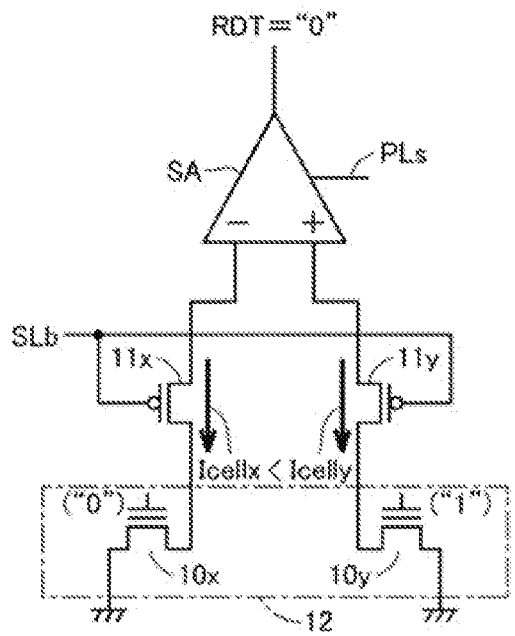
FIG. 3A is a conceptual circuit diagrams for describing data readout based on a complementary readout type of a flash memory.
Figure 3B:
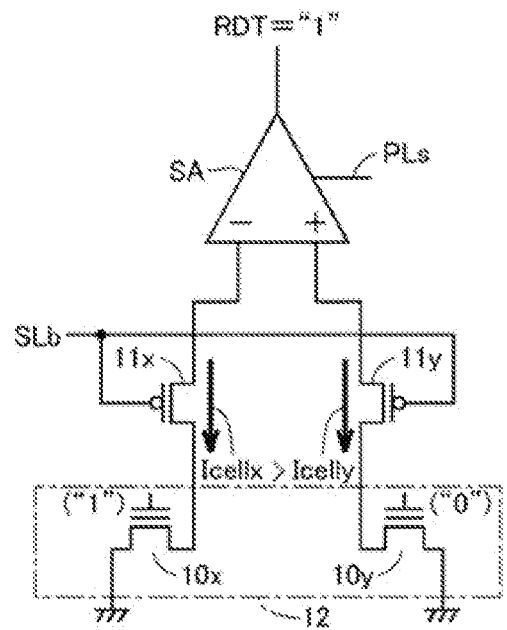
FIG. 3B is a conceptual circuit diagrams for describing data readout based on a complementary readout type of a flash memory.

Next, data readout in the complementary readout type is described with reference to FIGS. 3A, 3B and FIG. 4. As shown in FIGS. 3A and 3B, in the complementary readout type, data of one bit is stored by a twin cell 12 including two memory cells 10x and 10y.

With reference to FIG. 3A, the memory cell 10x is connected to one input node (negative terminal) of the sense amplifier SA through a selector 11x. The memory cell 10y is connected to the other input node (positive terminal) of the sense amplifier SA through a selector 11y.

The selectors 11x and 11y are each configured of a P-type MOS transistor, and a common selection signal SLb is input to each gate. When the selection signal SLb input to the selectors 11x and 11y corresponding to the twin cell 12 as the readout target is set at "0", a cell current Icellx of the memory cell 10x flows to the negative terminal of the sense amplifier SA, and a cell current Icelly of the memory cell 10y flows to the positive terminal of the sense amplifier SA.

The stored data in both of the memory cells 10x and 10y of the twin cell 12 in the erase state is "1". On the other hand, the stored data in the memory cells 10x and 10y of the twin cell 12 in the write state are set at one of "0" and "1", respectively, and "0" or "1" is stored.

As shown in FIG. 3A, when the write operation is performed on the memory cell 10x in the twin cell 12 in the erase state, the stored data in the memory cell 10x is changed to "0". On the other hand, the stored data in the memory cell 10y indicates "1". Here, since Icellx<Icelly, the sense amplifier SA outputs the readout data RDT="0". That is, the stored data in the twin cell 12 indicates "0".

By contrast, when the write operation is performed on the memory cell 10y in the twin cell 12 in the erase state, the stored data in the memory cell 10y is changed to "0". On the other hand, the stored data in the memory cell 10x still indicates "1". Here, since Icellx>Icelly, the sense amplifier SA outputs the readout data RDT="1". That is, the stored data in the twin cell 12 indicates "1".

Figure 4:
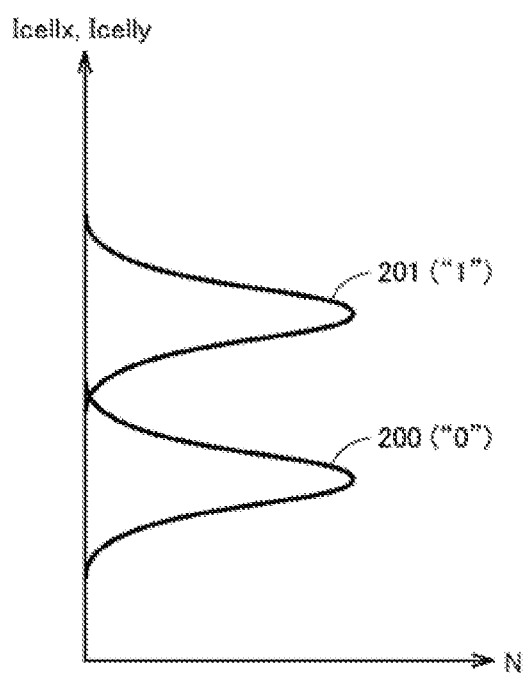
FIG. 4 is a distribution diagram of cell current for describing data readout based on a reference current type of FIG. 3.

FIG. 4 shows a distribution curve 200 of the cell currents Icellx and Icelly provided when the stored data in the plurality of memory cells 10 as a whole configuring the non-volatile semiconductor storage device indicates "0" and a distribution curve 201 of the cell currents Icellx and Icelly provided when the stored data therein indicates "1".

As described in FIG. 2, in the reference current readout type, when the distribution curves 200 and 201 overlap in the memory cells 10 as a whole, the erroneous determination occurs in the data readout based on the comparison in magnitude of the reference current Iref. By contrast, in the complementary readout type, even when the distribution curves 200 and 201 overlap in the plurality of memory cells 10 as a whole, the stored data can be correctly read out if the relation in magnitude of cell current between the two memory cells 10x and 10y in each twin cell 12 matches the stored data.

Therefore, in the complementary readout type, while two memory cells are required for storing one bit, the reliability in the data readout is improved. Also, since the voltage applied to the memory cells 10x and 10y at the time of erase operation can be more moderated than that of the reference current readout type, the number of rewritable times can be increased. That is, the complementary readout type is suitable for uses with small capacity and many number of rewritable times.

Next, as for the erase verify information, the reference current readout type and the complementary readout type are compared with each other. As described above, in the flash memory, data is not directly overwritten in an alreadywritten memory cell, and the data is written in the memory cell in the erase state. Thus, at the time of operation of the flash memory, it is required for each certain section that is a preset data write target unit to obtain the erase verify information indicating whether each certain section is in the rewritable state, that is, whether all of a plurality of memory cells included in each certain section are in the erase state.

In the present embodiment, explanation will be made below while an address in a non-volatile semiconductor storage device that stores data of n bits (n: an integer equal to or larger than 2) for each address is regarded as the certain section. That is, the erase verify information is generated for each address.

First, the generation of the erase verify information in the reference current readout type is described with reference to FIG. 5 and FIG. 6.

Figure 5:
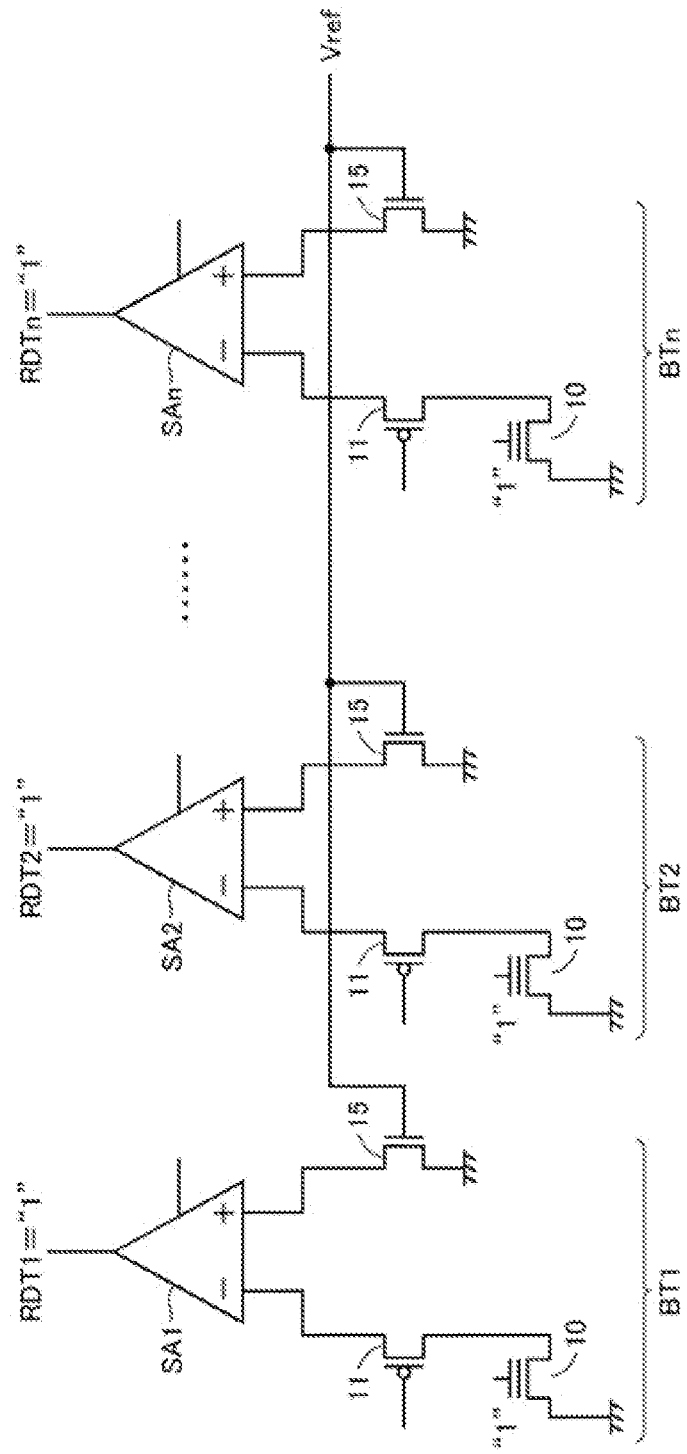
FIG. 5 is a conceptual circuit diagram for describing readout data from a memory cell in a writable state, based on the reference current readout type.

FIG. 5 shows a conceptual circuit diagram for describing the readout data RDT from the memory cell in the erase state in the reference current readout type.

As shown in FIG. 5, in the reference current readout type, "n" memory cells 10 are arranged in order to store pieces of data BT1 to BTn of n bits corresponding to one address. At the time of the data reading from this address, sense amplifiers SA1 to SAn output the readout data RDT1 to RDTn, respectively, indicating the stored data ("0" or "1") of the n memory cells 10.

When all of the n memory cells 10 are in the erase state, this address is in a writable state. Here, the stored data in the n memory cells 10 all indicate "1".

Figure 6:
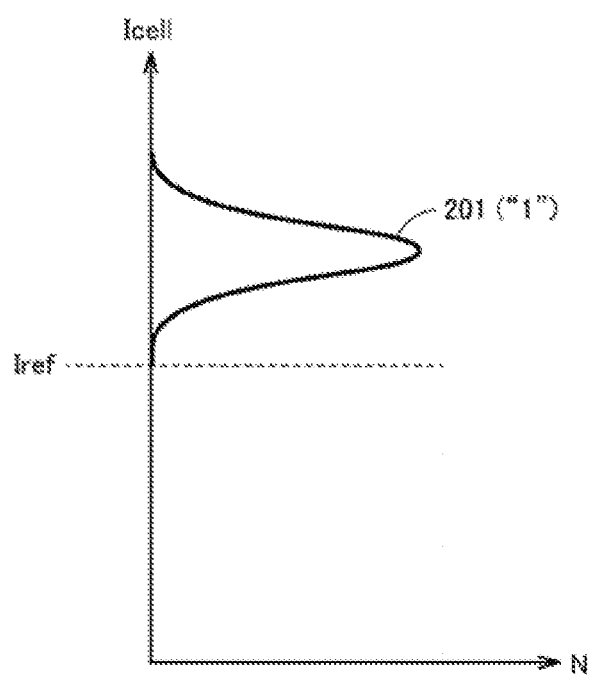
FIG. 6 is a conceptual diagram for describing a distribution of cell current in FIG. 5.

FIG. 6 shows a conceptual diagram for describing a distribution of the cell current in the writable state in the reference current readout type in FIG. 5.

As shown in FIG. 6, in the writable state in the reference current readout type, the n memory cells 10 are all in the erase state, and therefore, a distribution curve 201 of the cell current Icell is led to a higher current side than the reference current Iref.

As a result, as shown in FIG. 5, since the stored data "1" is read out from the n memory cells 10, the readout data RDT to RDTn all indicate "1". Therefore, when the write operation is performed on a certain address, the data readout is performed on the n memory cells 10 corresponding to this address, and the erase verify information for determining whether the address is in the writable state can be generated based on whether the readout data RDT1 to RDTn all indicate "1". For example, for each address, the erase verify information of one bit can be generated based on a logical product (AND) of the readout data RDT1 to RDTn.

Figure 7:
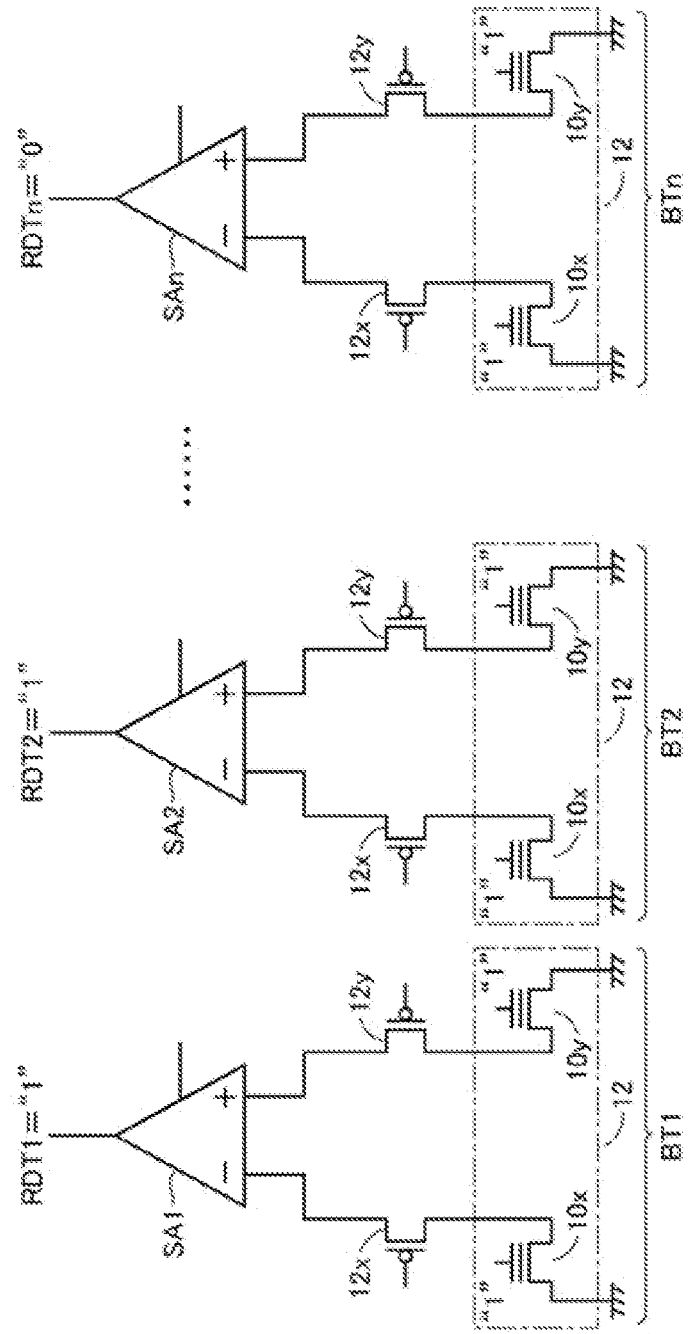
FIG. 7 is a conceptual circuit diagram for describing readout data from a memory cell in a writable state, based on the complementary readout type.

FIG. 7 shows a conceptual circuit diagram for describing readout data RDT from the memory cell in the erase state in the complementary readout type.

As shown in FIG. 7, in the complementary readout type, "n" twin cells 12 are arranged in order to store pieces of data BT1 to BTn of n bits corresponding to one address. Each of the "n" twin cells 12 includes a pair of the memory cell 10x and the memory cell 10y. At the time of the data reading from this address, sense amplifiers SA1 to SAn output the readout data RDT1 to RDTn, respectively, based on the comparison result in the cell current of the memory cells 10x and 10y in each of the "n" twin cells 12.

When all of the n twin cells 12 are in the erase state, this address is in the writable state. Here, in each twin cell 12, the stored data in the memory cells 10x and 10y both indicate "1".

As a result, each of the readout data RDT1 to RDTn from the n twin cells 12 is set at "0" or "1" based on a small difference in cell current between the memory cells 10x and 10y in each twin cell due to, for example, the threshold voltage variations in manufacturing under the same stored data. Therefore, in the complementary readout type, as different from the reference current readout type, the erase verify information cannot be generated for each address by the data readout from the n twin cells 12.

Therefore, in the complementary readout type, a memory cell is additionally arranged in order to generate the erase verify information for indicating information as to whether each address (write target unit) is in the writable state, that is, whether the n twin cells 12 are all in the erase state.

Figure 8:
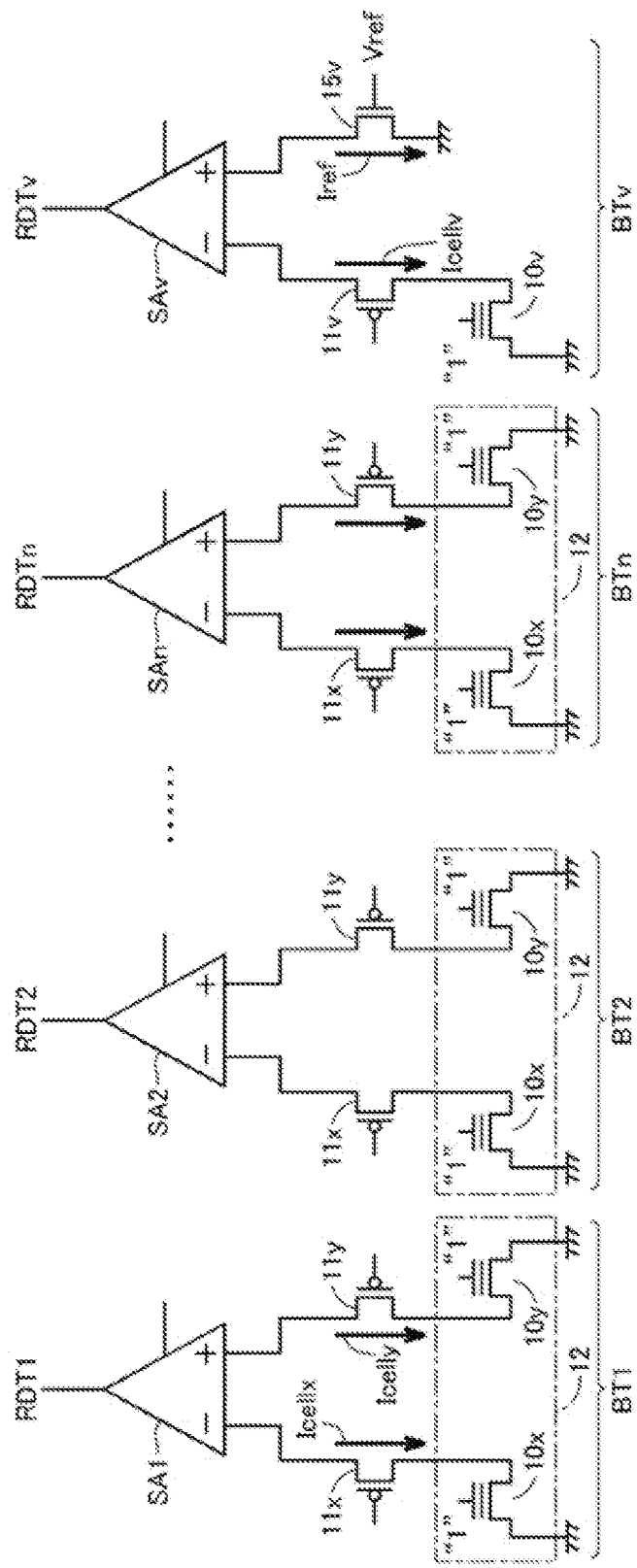
FIG. 8 is a conceptual circuit diagram for describing a first comparative example of a structure for generating erase verify information based on the complementary readout type.

FIG. 8 shows a conceptual circuit diagram for describing a first comparative example of a structure for generating the erase verify information in the complementary readout type.

With reference to FIG. 8, in the first comparative example, correspondingly to each address (write target unit), a memory cell 10v for storing the erase verify information (one bit) of this address is arranged in addition to the n twin cells 12 for the storage of the data of n bits. Furthermore, a sense amplifier SAv is arranged to read out the stored data in the memory cell 10v. The date readout from the memory cell 10v is performed by the reference current readout type described in FIG. 1.

Specifically, the memory cell 10v is electrically connected to one input node (negative terminal) of the sense amplifier SAv through a selector 11v. The selector 11v is turned ON at the time of erase verify operation of checking whether the cell is in the writable state before the data writing in the corresponding n twin cells 12. With this, the sense amplifier SAv outputs readout data RDTv indicating the stored data of the memory cell 10v, based on the comparison in magnitude between a cell current Icellv in the memory cell 10v and the reference current Iref similar to that in FIG. 1.

At the time of erase operation taking the n twin cells 12 as the target, the memory cell 10v is also a target for the erase operation in common with the memory cells 10x and 10y of the n twin cells 12. With this, the stored data in the memory cell 10v together with the memory cells 10x and 10y of the n twin cells 12 also indicates "1".

In data write operation on the n twin cells 12 as targets, the memory cell 10v is also a target for the data writing in parallel. With this, as described in FIGS. 3A and 3B, in each twin cell 12, the stored data of either one of the memory cells 10x and 10y is changed from "1" to "0" and the stored data in the memory cell 10v is also changed from "1" to "0".

Therefore, in the first comparative example of FIG. 8, the stored date in one memory cell 10v indicates the erase verify information. That is, when the stored data in the memory cell 10v indicates "1", the corresponding n twin cells 12 are all in the erase state, and it can be determined that this address (write target unit) is in the writable state.

Figure 9A:
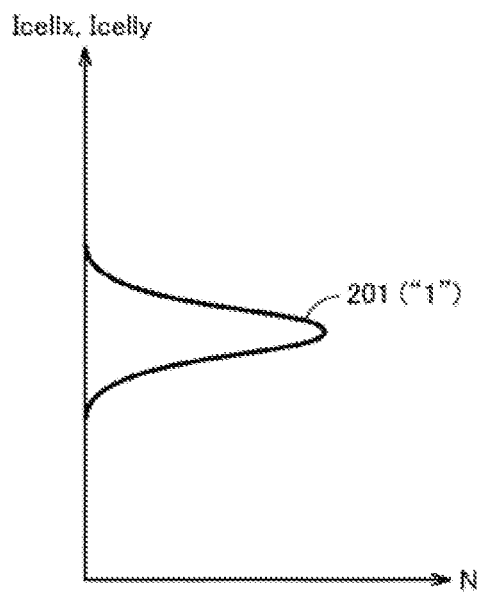
FIG. 9A is a distribution diagram of cell current in an erase state in the structure of FIG. 8.
Figure 9B:
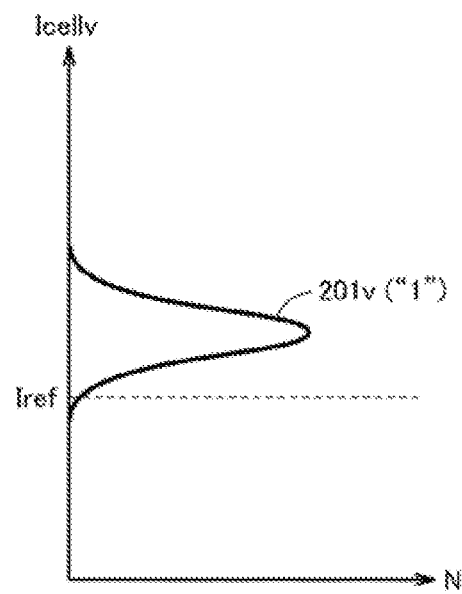
FIG. 9B is a distribution diagram of cell current in an erase state in the structure of FIG. 8.

FIGS. 9A and 9B show distribution diagrams of cell current provided when the structure of FIG. 8 is in the erase state. While FIG. 9A shows a distribution of cell current in the twin cell 12, FIG. 9B shows a distribution of cell current in the memory cell 10v storing the erase verify information.

With reference to FIG. 9A, in the erase state, the stored data of the memory cells 10x and 10y configuring each twin cell 12 are identical at "1", and the memory cell currents Icellx and Icelly distribute to follow the distribution curve 201.

On the other hand, as shown in FIG. 9B, in the erase state, the stored data in the memory cell 10v indicates "1", and thus, the cell current Icellv in the memory cell 10v distributes to follow a distribution curve 201v provided when the stored data indicates "1". The distribution curve 201v is equivalent to the distribution curve 201 of FIG. 9A.

Figure 10A:
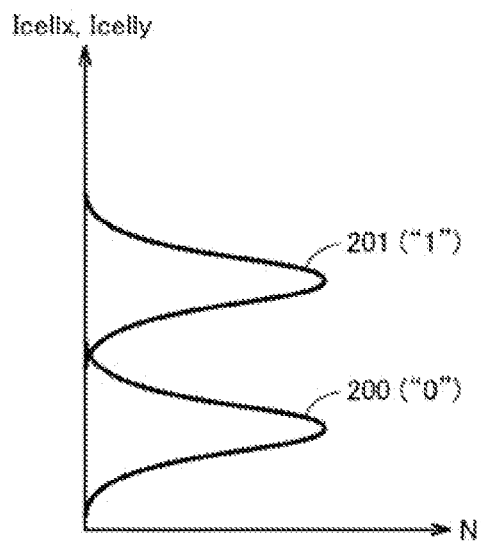
FIG. 10A is a distribution diagram of cell current in a write state in the structure of FIG. 8.
Figure 10B:
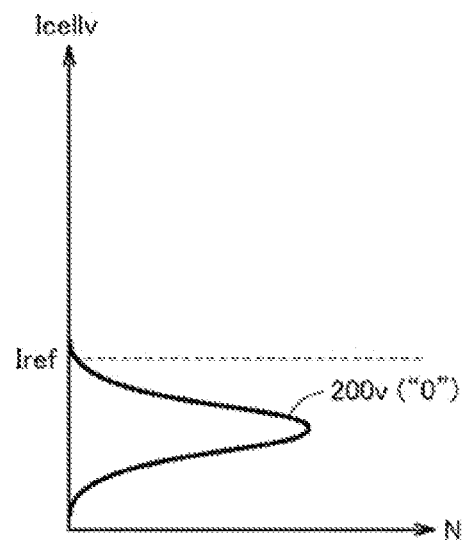
FIG. 10B is a distribution diagram of cell current in a write state in the structure of FIG. 8.

FIGS. 10A and 10B show distribution diagrams of cell current provided when the structure of FIG. 8 is in the write state. While FIG. 10A shows a distribution of cell current in each twin cell 12, FIG. 10B shows a distribution of cell current in the memory cell 10v storing the erase verify information.

With reference to FIG. 10A, in the write state, the stored data in the memory cells 10x and 10y configuring each twin cell 12 indicates one of "0" and "1" and the other, respectively. Thus, the memory cell currents Icellx and Icelly distribute to follow a distribution curve 200 and a distribution curve 201, respectively.

On the other hand, as shown in FIG. 10B, in the write state, the stored data in the memory cell 10v indicates "0", and thus, a cell current Icellv in the memory cell 10v distribute to follow the distribution curve 200v provided when the stored data indicates "0". The distribution curve 200v is equivalent to the distribution curve 200 of FIG. 10A.

From a comparison between FIG. 9B and FIG. 10B, the erase verify information can be obtained by separating the distribution curve 200v and 201v. That is, the erase verify information can be obtained by comparing the cell current Icellv in the memory cell 10v and the reference current Iref to read out the stored data in the memory cell 10v. That is, readout data RDTv generated by the sense amplifier SAv of FIG. 8 can be used as the erase verify information.

However, in the structure of FIG. 8, the erase verify information is generated by the reference current readout type similar to that in FIG. 1. Therefore, reliability in the erase verify information has a problem regarding variations in cell current of the memory cell 10v as similar to that described in FIG. 2. With this, there is a concern that the erase verify information becomes a bottleneck as to the reliability in the non-volatile semiconductor storage device (flash memory).

Figure 11:
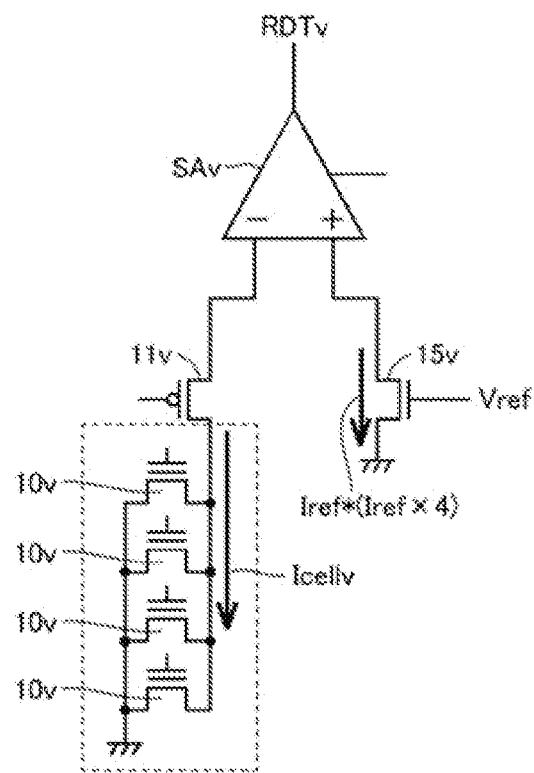
FIG. 11 is a conceptual circuit diagram for describing a second comparative example of the structure for generating the erase verify information based on the complementary readout type.

FIG. 11 shows a second comparative example of the structure for generating the erase verify information in the complementary readout type.

With reference to FIG. 11, in the second comparative example, in order to enhance the reliability of the erase verify information, a plurality of (for example, four) memory cells 10v are connected in parallel, and store the erase verify information of one bit.

Those four memory cells 10v are targets for erase operation or write operation in parallel. Therefore, when the n twin cells 12 at the corresponding address are in the erase state, the stored data in the four memory cells 10v are identical at "1". On the other hand, when the n twin cells 12 at the corresponding address are in the write state, the stored data in the four memory cells 10v are identical at "0".

In FIG. 11, a cell current Icellv is a sum of cell currents of four memory cells 10 connected in parallel. Thus, compared with the structure of FIG. 8, a cell current Icellv flowing in the sense amplifier SA is fourfold. Therefore, a reference current Iref* flowing in a reference cell 15v is approximately four times as much as the reference current Iref of FIG. 8. For example, in the structure of FIG. 11, the transistor size of the reference cell 15v is designed to be four times as large as the transistor size of the reference cell 15v of FIG. 11, and a relation "Iref*=4×IRef" can be achieved.

Figures 12A, 12B:
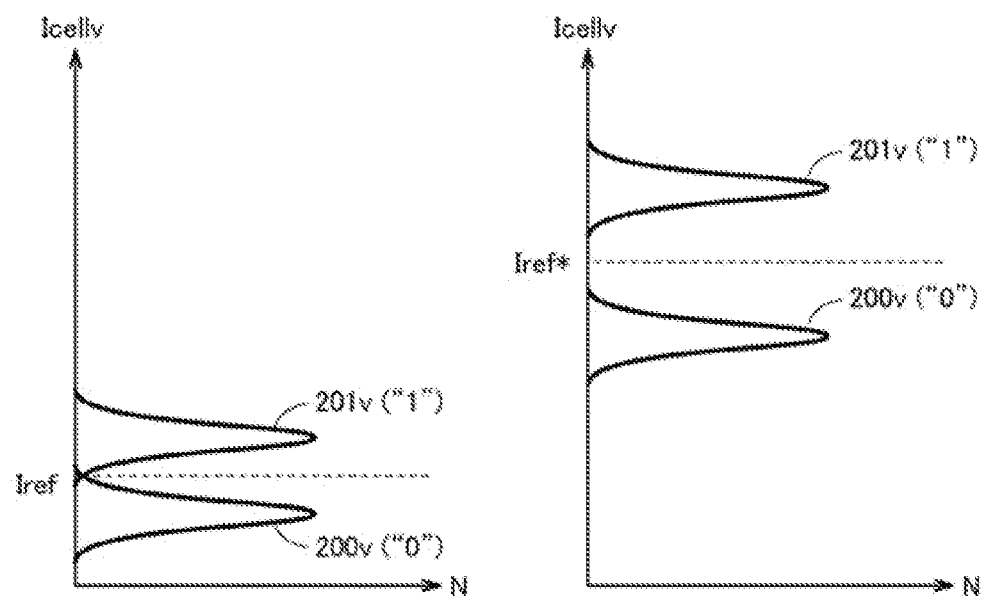
FIG. 12A is a distribution diagram of cell current for describing a difference in cell current with respect to a difference in the number of memory cells for generating the erase verify information.
FIG. 12B is a distribution diagram of cell current for describing a difference in cell current with respect to a difference in the number of memory cells for generating the erase verify information.

FIGS. 12A and 12B show distribution diagrams of cell current for describing a difference in the cell current Icellv with respect to a difference in the number of memory cells 10v.

FIG. 12A shows a distribution diagram of the cell current Icell in the first example of structure (FIG. 8) in which the erase verify information is stored by one memory cell 10v. While the cell current Icellv in the erase state distributes to follow the distribution curve 201, the cell current Icellv in the write state distributes to follow the distribution curve 200.

Thus, in comparison between the cell current Icellv and the reference current Iref set so as to separate the distribution curves 200 and 201, occurrence of the overlap between the distribution curves 200 and 201 due to variations in manufacturing, variations in degradation, and so forth causes a possibility of the erroneous readout of the erase verify information.

By contrast, FIG. 12B shows a distribution diagram of the cell current Icell in the second example of structure (FIG. 11) in which the erase verify information is stored by four memory cells 10v. While the cell current Icellv in the erase state distributes to follow a distribution curve 201v of FIG. 12A, the cell current Icellv in the write state distributes to follow a distribution curve 200v.

The distribution curves 200v and 201v represents a distribution of the sum of four cell currents. Thus, under the distribution curves 200v and 201v, a difference in the cell current Icellv between the erase state and the write state is expanded more than a difference between the cell currents Icellv following the distribution curves 200 and 201 of one cell current.

In the second comparative example, by enhancing the reliability of the erase verify information output from the four memory cells 10v, the erase verify information can be prevented from becoming the bottleneck as to reliability of the non-volatile semiconductor storage device (flash memory).

However, since the arrangement of the memory cells to generate the erase verify information increases the number of arranged memory cells in the non-volatile semiconductor storage device as a whole, there is a concern of causing an increase in size and cost.

Figure 13:
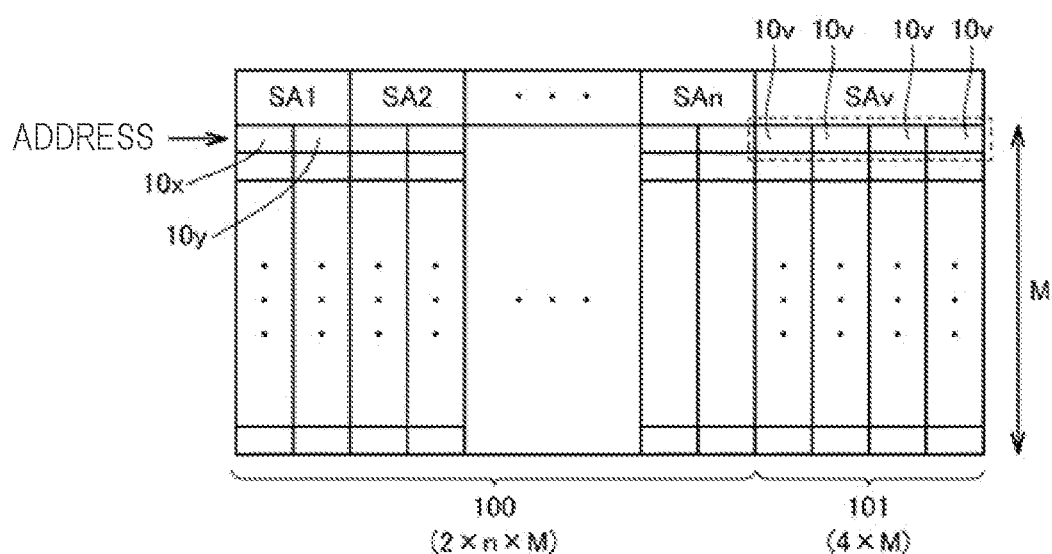
FIG. 13 is a conceptual diagram for describing an example of a layout of arranged memory cells in the non-volatile semiconductor storage device as a whole in a second comparative example.

FIG. 13 shows a conceptual diagram for describing an example of a layout of the arranged memory cells in the non-volatile semiconductor storage device as a whole in the second comparative example.

With reference to FIG. 13, as described above, in the non-volatile semiconductor storage device of the complementary readout type in which data of n bits is stored for each address, in M addresses (M: an integer equal to or larger than 2) as a whole, (2×n×M) memory cells 10x and 10y are arranged for data storage by using a region 100.

Furthermore, in the second comparative example, in order to generate the erase verify information, four memory cells 10v surrounded by a dotted frame are additionally arranged for each address. In the non-volatile semiconductor storage device of the complementary readout type, correspondingly to the M addresses as a whole, (4×M) memory cells 10v are arranged for generation of the erase verify information by using a region 101. As a result, for example, when n=8, the number of the additionally-arranged memory cells in the region 110 in order to generate the erase verify information increases by 4/(2×8)=25(%) with respect to the number of the arranged memory cells in the region 100 for the data storage.

In this manner, in the non-volatile semiconductor storage device of the complementary readout type, it would be understood that the additional arrangement of the memory cells for generating the erase verify information for each write target unit (address) causes a problem in view of the size and the cost.

First Embodiment

In a first embodiment, explanation will be made about a structure in the non-volatile semiconductor storage device of the complementary readout type for generating the erase verify information without the additional arrangement of the memory cell.

Figure 15:
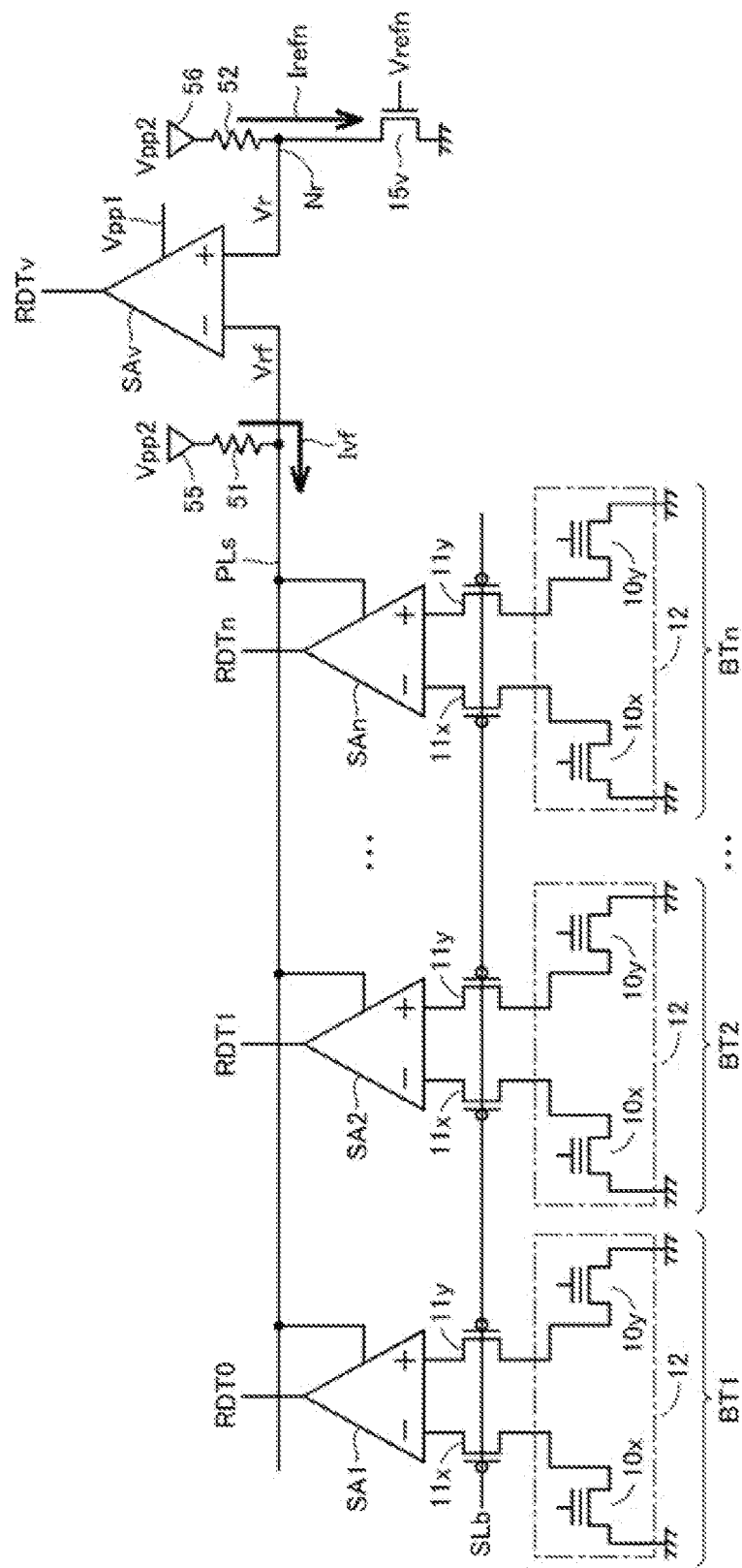
FIG. 15 is a conceptual circuit diagram for describing a structure for generating the erase verify information in the non-volatile semiconductor storage device of the complementary readout type according to the first embodiment.

FIG. 15 is a conceptual circuit diagram for describing a structure for generating the erase verify information in the non-volatile semiconductor storage device of the complementary readout type according to the first embodiment. FIG. 15 shows also a structure for generating the erase verify information corresponding to n twin cells 12 for one write target unit (address).

Figure 14:
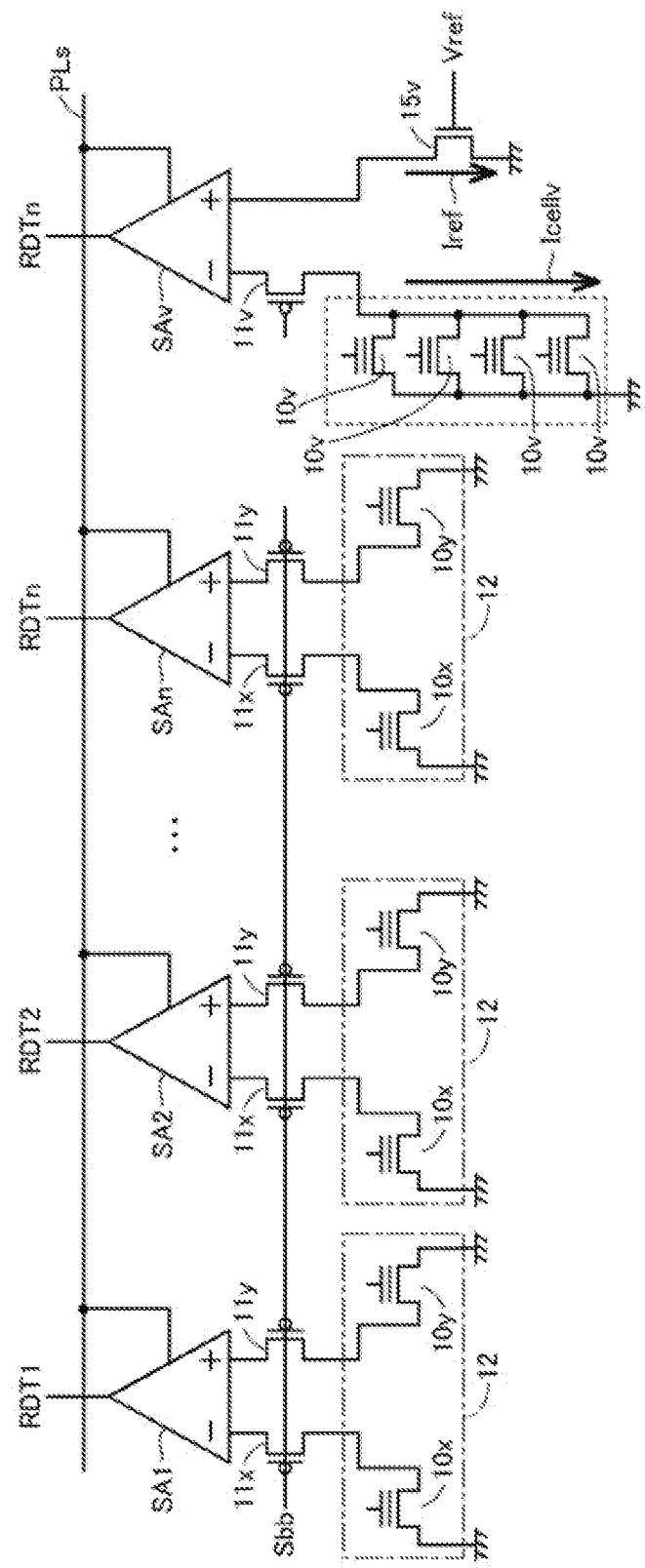
FIG. 14 is a conceptual circuit diagram for describing a structure for generating the erase verify information in the non-volatile semiconductor storage device of the complementary readout type according to the second comparative example.

Furthermore, for the purpose of comparison with FIG. 15, FIG. 14 shows a conceptual circuit diagram for describing a structure for generating the erase verify information in the non-volatile semiconductor storage device of the complementary readout type according to the second comparative example. In FIG. 14, in order to generate the erase verify information, in addition to a structure for storing data of n bits, a sense amplifier SAv, a reference cell 15v, and additionally-arranged four memory cells 10v are additionally arranged. The structure of these additionally-arranged components are similar to that of FIG. 11, and therefore, detailed description is not repeated.

With reference to FIG. 15, in the non-volatile semiconductor storage device of the complementary readout type according to the first embodiment, the arrangement of the memory cells 10v in FIG. 14 is omitted. One input node (negative terminal) of the sense amplifier SAv outputting the erase verify information is connected to a power supply line PLs for supplying a power supply voltage Vpp2 of sense amplifiers SA1 to SAn. The power supply line PLs is electrically connected to a power supply node 55 for supplying the power supply voltage Vpp2 through a resistive element 51 having an electrical resistance value R1.

As described later, at the time of erase verify operation, a verify current Ivf flows, which is a sum of currents flowing from the power supply line PLs to the n sense amplifiers SA1 to SAn. Therefore, at one terminal of the sense amplifier SAv, a voltage Vvf occurs at the node Nr, the voltage Vvf being lower than the power supply voltage Vpp2 by a voltage drop caused at the resistive element 51 by the verify current Ivf. That is, the voltage Vrf input to the sense amplifier SAv is expressed as the following Equation (1).

$$Vvf=Vpp2-Ivf \times R1 \quad (1)$$

That is, the voltage Vvf is equivalent to a voltage obtained by current/voltage conversion of the verify current Ivf and the electrical resistance value R1. As the verify current Ivf is larger, the voltage Vvf is lower.

On the other hand, the other input node (positive terminal) of the sense amplifier SAv is connected to a node Nr connected to the reference cell 15v. The reference cell 15v is connected between the node Nr and a ground node for supplying ground voltage. The node Nr is electrically connected through a resistive element 52 having the electrical resistance value R1 to a power supply node 56 for supplying the power supply voltage Vpp2. The reference cell 15v receives a reference voltage Vrefn as its input at its gate, and generates a reference current Irefn. As a result, a voltage Vr occurs at the node Nr, the voltage Vr being lower than the power supply voltage Vpp2 by a voltage drop occurring at the resistive element 52 by the reference current Irefn. Therefore, the voltage Vr input to the sense amplifier SAv is expressed as the following Equation (2).

$$Vr=Vpp2-Irefn \times R1 \quad (2)$$

That is, the voltage Vr is equivalent to a voltage obtained by current/voltage conversion of the reference current Irefn and the electrical resistance value R1. As the reference current Irefn is larger, the voltage Vr is lower.

The sense amplifier SAv operates upon receiving a power supply voltage Vpp1 from a power supply line independent from the power supply nodes 55 and 56, and outputs readout data RDTv based on comparison in magnitude between the voltages Vvf and Vr. Since the sense amplifier SAv compares the verify current Ivf and the reference current Irefn through the comparison the voltages Vvf and Vr, the readout data RDTv from the sense amplifier SAv is equivalent to the erase verify information.

When Irefn>Ivf, a relation "Vr<Vvf" is set, and therefore, the sense amplifier SAv outputs RDTv="0". On the other hand, when Ivf>Irefn, a relation "Vvf<Vr" is set, and therefore, the sense amplifier SAv outputs RDTv="1".

Figure 16:
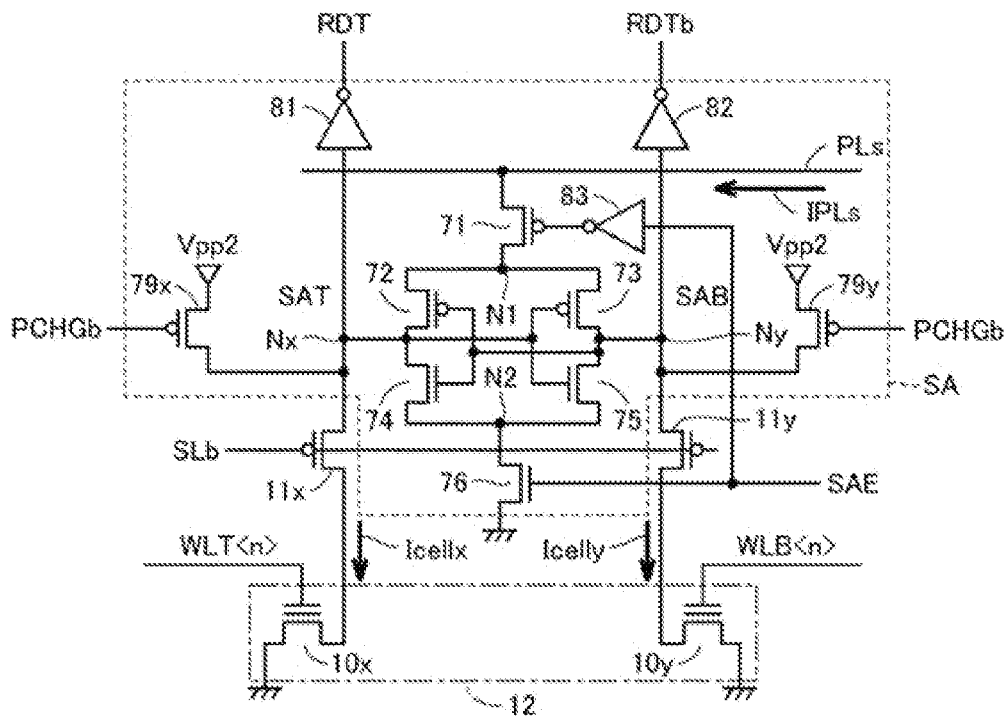
FIG. 16 is a circuit diagram for describing a structure of a sense amplifier shown in FIG. 15.

FIG. 16 shows a circuit diagram for describing an example of structure of each of the sense amplifiers SA1 to SAn. Since the structure of each of the sense amplifiers SA1 to SAn is similar, the sense amplifiers SA1 to SAn are collectively represented as a sense amplifier SA in FIG. 16.

With reference to FIG. 16, the sense amplifier SA includes P-type transistors 71 to 73, 79x, and 79y, N-type transistors 74 to 76, inverters 81 to 83, and nodes Nx and Ny.

The node Nx is equivalent to one input node (negative terminal) of the sense amplifier SA, and the node Ny is equivalent to the other input node (positive terminal) of the sense amplifier SA. As with FIGS. 3A and 3B, while the node Nx is connected to the memory cell 10x through the selector 11x, the node Ny is connected to the memory cell 10y through the selector 11y.

The transistors 72 and 74 are connected in series between nodes N1 and N2 so as to put the node Nx therebetween. Furthermore, the gates of the transistors 72 and 74 are connected to the node Ny in common. On the other hand, the transistors 73 and 75 are connect in series between nodes N1 and N2 so as to put the node Ny therebetween. Furthermore, the gates of the transistors 73 and 75 are connected to the node Nx in common. With this, the transistors 72 to 75 operate as a CMOS (Complementary Metal Oxide Semiconductor) operational amplifier for amplifying a voltage difference between the nodes Nx and Ny.

The transistor 71 is connected between a power supply line PLs and the node N1, and the transistor 76 is connected between the node N2 and the ground node. To the gate of the transistor 76, an enable signal SAE of the sensor amplifier SA is input. To the gate of the transistor 71, an inverted signal of the enable signal SAE output from the inverter 83 is input. Therefore, in a period where the enable signal SAE="1", the transistors 71 and 76 are turned ON, and thus, an operating current is supplied to the CMOS operational amplifier.

The transistor 79x is connected between a node for supplying the power supply voltage Vpp2 and the node Nx. The transistor 79y is connected between a node for supplying the power supply voltage Vpp2 and the node Ny. To the gates of the p-type transistors 79x and 79y, a pre-charge signal PCHGb set at "0" in a pre-charge period is input. That is, the transistors 79x and 79y operate as pre-charge switches of the nodes Nx and Ny, respectively.

The inverter 81 outputs the readout data RDT when receiving a voltage SAT of the node Nx as its input. The inverter 82 outputs inverted readout data RDTb that is complementary to the readout data RDT, when receiving a voltage SAB of the node Ny as its input.

Figure 17:
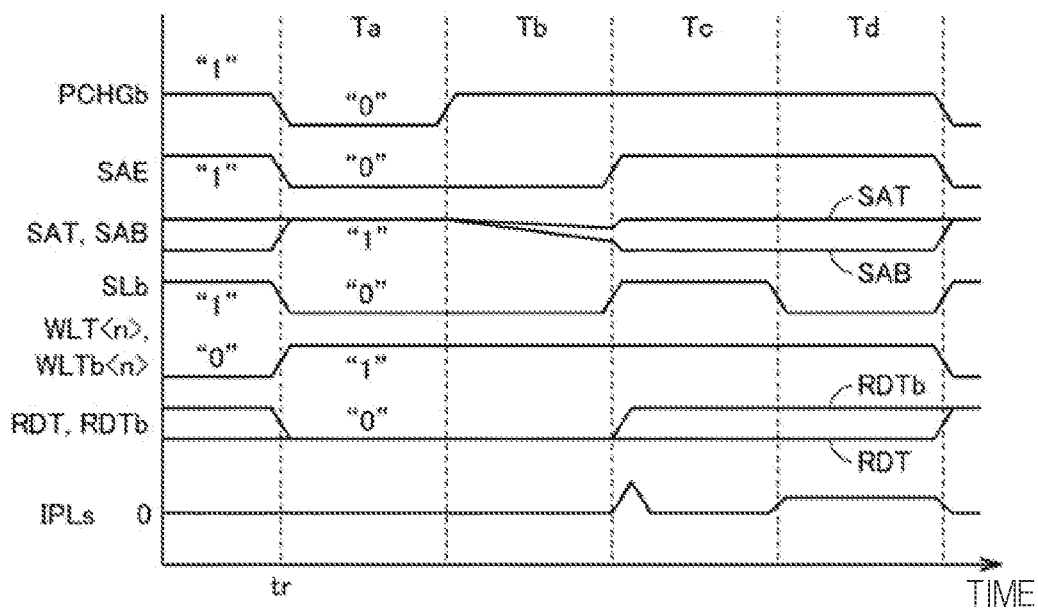
FIG. 17 is an operating waveform diagram of the sense amplifier shown in FIG. 15.

FIG. 17 shows an operating waveform diagram of the sense amplifier SA shown in FIG. 15. First, normal data readout from a twin cell 12 in a pre-charge period Ta, a sampling period Tb, and a sense period Tc is described. The memory cells 10x and 10y are set in a data readout state when word lines WLT<n> and WLB<n> connected to the gates of the memory cells 10x and 10y are changed from "0" to "1".

When data readout from the twin cell 12 is started at a time tr, the pre-charge period Ta is provided. In the pre-charge period Ta, a pre-charge signal PCHGb is changed from "1" to "0", and the enable signal SAE is set at "0". Furthermore, a selection signal SLb input to the selectors 11x and 11y is changed from "1" to "0".

When the transistors 79x and 79y are turned ON, the nodes Nx and Ny are turned into a state with the flow of the cell currents of the memory cells 10x and 10y therein. On the other hand, since the enable signal SAE indicates "0", no operating current is supplied to the CMOS operational amplifier. As a result, the voltage SAT at the node Nx and the voltage SAB at the node Ny are pre-charged at a voltage level (power supply voltage Vpp2) equivalent to "1". By contrast, the readout data RDT and the inverted readout data RDTb are set at "0".

Next, in the sampling period Tb, the pre-charge signal PCHGb is changed from "0" to "1".

When the transistors 79x and 79y (pre-charge switches) are turned OFF, the voltages SAT and SAB at the nodes Nx and Ny are lowered by discharge due to the readout currents Icellx and Icelly. On the other hand, since the enable signal SAE is maintained at "0" also in the sampling period Tb, no operating current is supplied to the CMOS operational amplifier. Therefore, in the sampling period Tb, the voltage difference between the nodes Nx and Ny (difference between the voltages SAT and SAB) is not amplified.

As a result, a voltage difference depending on the current difference between the cell currents Icellx and Icelly is caused between the nodes Nx and Ny. In the example of FIG. 17, since a relation "Icellx<Icelly" is established, a voltage drop rate of the voltage SAT (node Nx) is smaller than a voltage drop rate of the voltage SAB (node Ny), which results in a relation "SAT>SAB".

Next, in the sense period Tc, the selection signal SLb is changed from "0" to "1". When the selectors 11x and 11y are turned OFF, the nodes Nx and Ny are electrically separated from the memory cells 10x and 10y. Furthermore, the enable signal SAE is changed from "0" to "1", and an operating current is supplied to the CMOS operational amplifier formed of the transistors 72 to 75.

With this, in the sense period Tc, the voltages SAT and SAB change so as to amplify the voltage difference between the nodes Nx and Ny occurring in the sampling period Tb. In the example of FIG. 17 in which the sense period Tc is started in the state of SAB<SAT, in the CMOS sense amplifier, while the transistors 72 and 75 are turned ON, the transistors 73 and 74 are turned OFF. As a result, "amplifying operation" is performed so that the voltage SAT is increased to "1" (power supply voltage Vpp2) while the ground voltage is transmitted to the node Ny by the electrical connection of the node Nx to the power supply line PLs, which results in the decrease of the voltage SAB down to "0" (ground voltage). By the above-described amplifying operation of the CMOS operational amplifier, a current equivalent to the operating current of the CMOS operational amplifier occurs as a current IPLs on the power supply line PLs.

In the sense period Tc, based on the voltages SAT and SAB having the amplified voltage difference therebtween, the readout data RDT and the inverted readout data RDTb are generated. In the example of FIG. 17, since the relation "Icellx<Icelly" is established, that is, the twin cell 12 is in the state of FIG. 3A, the level of the voltage SAT ("1") is inverted to set the readout data RDT="0".

Note that the relation "Icellx>Icelly" is established when the twin cell 12 is in the state of FIG. 3B. Therefore, in the sampling period Tb, the voltage SAT becomes lower than the voltage SAB (SAT<SAB) in contrast to the example of FIG. 17. As a result, in the sense period Tc, in the CMOS sense amplifier, the transistors 73 and 74 are turned ON while the transistors 72 and 75 are turned OFF. As a result, the "amplifying operation" is performed so that the voltage SAT is increased to "1" (power supply voltage Vpp2) while the ground voltage is transmitted to the node Nx by the electrical connection of the node Ny to the power supply line PLs, which results in the decrease of the voltage SAT down to "0" (ground voltage). By this manner, the level of the voltage SAT is inverted to set the readout data RDT="1".

In this manner, in the sense period Tc, as for the nodes Nx and Ny equivalent to input nodes of the sense amplifier SA, a voltage difference occurs between the nodes Nx and Ny so that one node connected to one memory cell having a small cell current of the memory cells 10x and 10y configuring the twin cell 12 is set at "1" while the other node is set at "0".

In the non-volatile semiconductor storage device of the complementary readout type according to the first embodiment, at the time of erase verify operation, an erase verify period Td is further provided after the operations in the pre-charge period Ta, the sampling period Tb, and the sense period Tc similar to normal data readout are performed on the twin cell 12.

As shown in FIG. 17, in the erase verify period Td, from the state in the sense period Tc, the selection signal Slabs is changed from "1" to "0" to turn the selectors 11x and 11y ON again. With this, the nodes Nx and Ny are electrically connected to the memory cells 10x and 10y in the data readout state in which "1" is input to the gate from the word lines WLT<n> and WLTb<n>, respectively.

Figure 18:
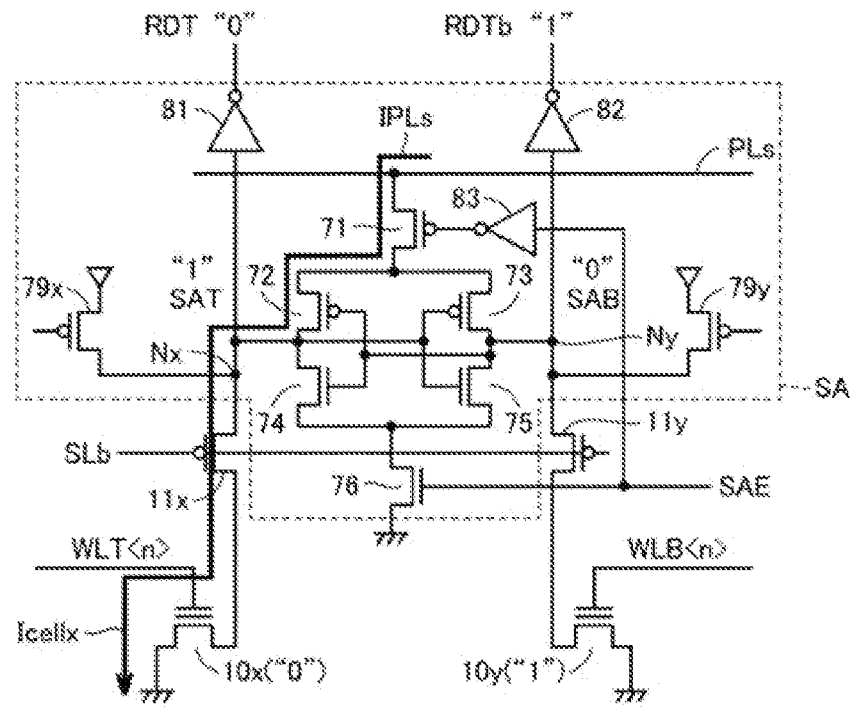
FIG. 18 is a circuit diagram for describing a current path in an erase verify period with respect to a twin cell in the write state in FIG. 16.

FIG. 18 shows a circuit diagram for describing a current path in the erase verify period with respect to the twin cell 12 in the write state. In FIG. 18, the circuit diagram of FIG. 16 is overwritten with a path of the current IPLs occurring in the erase verify period Td.

In the twin cell 12 in the write state, either one of the memory cells 10x and 10y is in the write state, and the other is in the erase state. In FIG. 18, as similar to FIG. 3A, in the twin cell 12, the memory cell 10x is in the write state (stored data "0") and the memory cell 10y is in the erase state (stored data "1").

Therefore, at the end of the sense period Tc, by the amplifying operation of the CMOS operational amplifier, a voltage difference is caused between the nodes Nx and Ny so that the voltage SAT indicates "1" while the voltage SAB indicates "0". Therefore, in the CMOS operational amplifier, when the transistors 72 and 75 are turned ON while the transistors 73 and 74 are turned OFF, a state with a current path formed between the power supply line PLs and the node Nx is caused.

In the erase verify period Td, when the selectors 11x and 11y are turned ON from this state, a current path is formed from the power supply path PLs to the node Nx and the memory cell 10x by using the current path (transistor 72) in the CMOS sense amplifier. As a result, a current IPLs equivalent to the cell current in the memory cell 10x in the write state occurs on the power supply line PLs.

Note that, as opposite to the example of FIG. 18, when the memory cell 10x is in the erase state (stored data "1") while the memory cell 10y is in the write state (stored data "0"), in contrast to the above, the voltage SAB indicates "1" while the voltage SAT indicates "0" at the end of the sense period Tc. Therefore, in the CMOS operational amplifier, a state in which the transistors 73 and 74 are turned ON while the transistors 72 and 75 are turned OFF is caused.

From this state, a current path is formed through the transistors 71 and 73 from the power supply line PLs to the node Ny and the memory cell 10y when the selectors 11x and 11y are turned ON. As a result, the current IPLs equivalent to the cell current in the memory cell 10y in the write state occurs on the power supply line PLs.

In this manner, in the erase verify period Td, in each sense amplifier SA, the current IPLs equivalent to the cell current in one memory cell having a small cell current of the memory cells 10x and 10y configuring the twin cell 12, occurs on the power supply line PLs.

Figure 19:
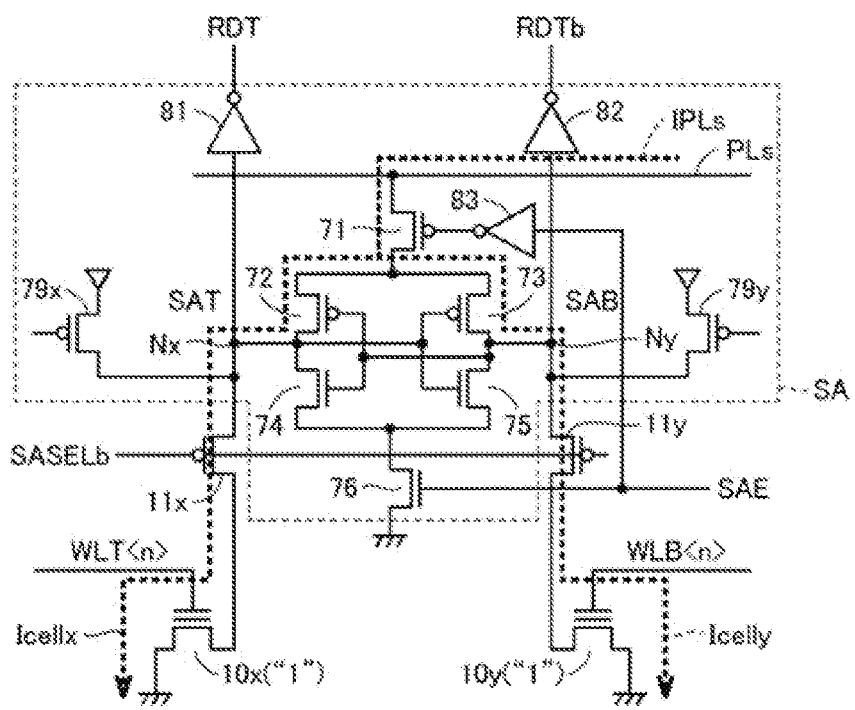
FIG. 19 is a is a circuit diagram for describing a current path in an erase verify period with respect to a twin cell in the erase state in FIG. 16.

FIG. 19 shows a circuit diagram for describing a current path in the erase verify period with respect to the twin cell in the erase state. Also in FIG. 19, the circuit diagram of FIG. 16 is overwritten with a path of the current IPLs occurring in the erase verify period Td.

In the twin cell 12 in the erase state, both of the memory cells 10x and 10y are maintained in the erase state (stored data "1"). Thus, the cell current in the memory cells 10x and 10y is equivalent to the cell current in the erase state. However, in the sampling period Tb, a small voltage difference occurs between the nodes Nx an Ny due to influences such as a small current difference noise, or the like due to variations in manufacturing. As a result, in the sense period Tc, due to the amplification of the small voltage difference, one of the voltages SAT and SAB increases to "1" while the other decreases to "0". However, it is not determined which one of the voltages SAT and SAB increases to "1".

In this manner, at the end of the sense period Tc, in the CMOS operational amplifier, one of a state with the transistors 72 and 75 turned ON and a state with the transistors 73 and 74 turned ON is formed.

Therefore, in the erase verify period Td, in accordance with the small cell current difference between the memory cells 10x and 10y both in the erase state, one of the cell currents of the memory cells 10x and 10y occurs on the power supply line PLs as a current IPLs indicated by a dotted line in FIG. 19.

Figure 20:
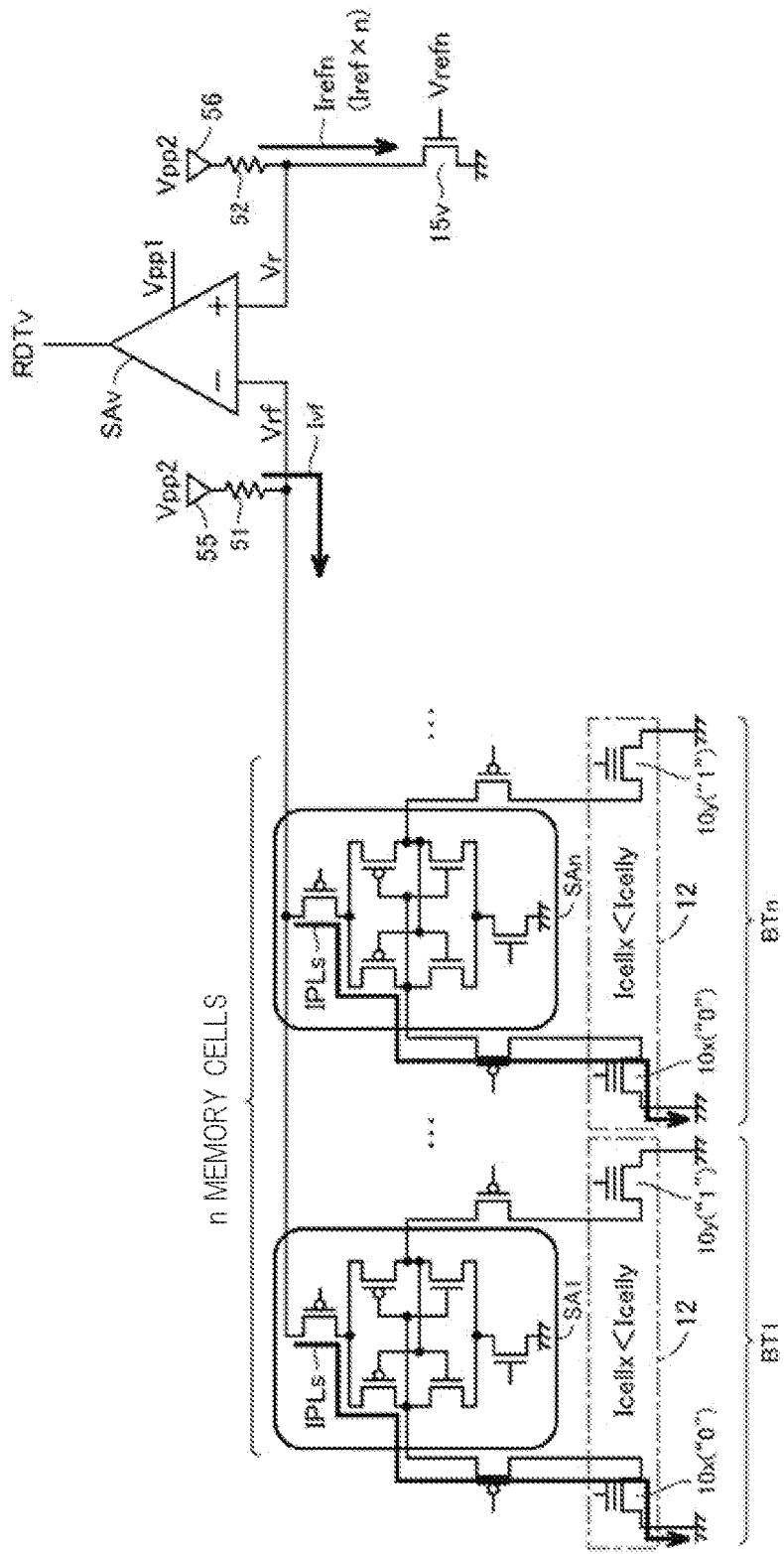
FIG. 20 is a conceptual circuit diagram for describing erase verify operation of the non-volatile semiconductor storage device of the complementary readout type according to the first embodiment.

FIG. 20 is a conceptual circuit diagram for describing the erase verify operation of the non-volatile semiconductor storage device of the complementary readout type according to the first embodiment.

With reference to FIG. 20, in the erase verify operation of the non-volatile semiconductor storage device according to the first embodiment, the pre-charge period Ta, the sampling period Tb, the sense period Tc and the erase verify period Td of FIG. 17 are sequentially provided. With this, the above-described current IPLs occurs in the sense amplifiers SA1 to SAn in the erase verify period Td. Thus, in the power supply line PLs as a whole, it would be understood that the verify current Ivf that is the sum of the currents IPLs in the n sense amplifiers SA occurs.

Figure 21A:
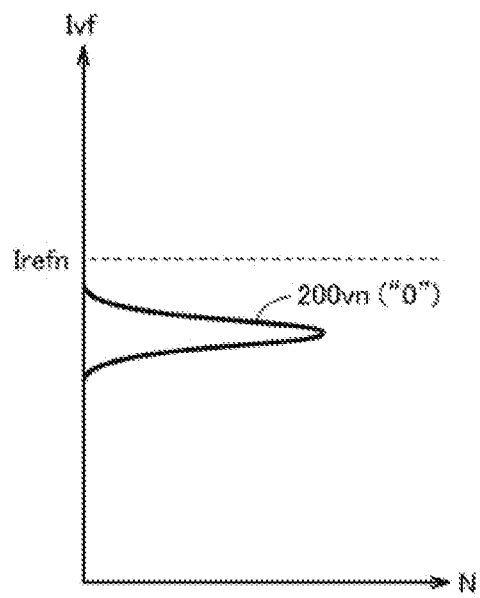
FIG. 21A is a distribution diagram of verify current at the time of erase verify operation.
Figure 21B:
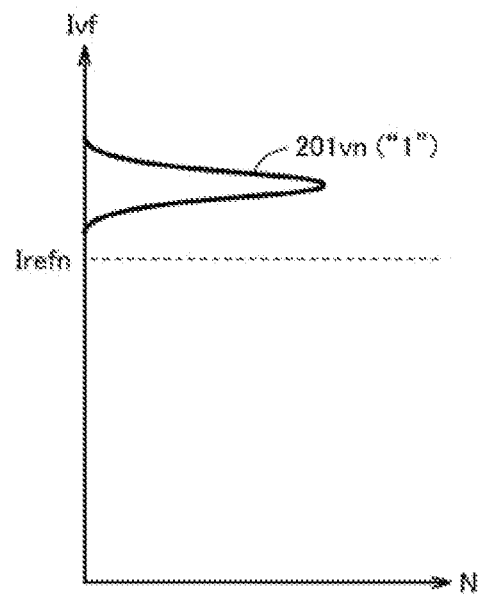
FIG. 21B is a distribution diagram of verify current at the time of erase verify operation.

FIGS. 21A and 21B show distribution diagrams of the verify current. FIG. 21A shows a distribution of the verify current occurring in the erase verify operation on the twin cell 12 in the write state. As described with reference to FIG. 18, in the twin cell 12 in the write state, in the erase verify period Td, the cell current of one memory cell in the write state (stored data "0") of the memory cells 10x and 10y flows as a current IPLs from the power supply line PLs to the sense amplifier SA.

Therefore, the verify current Ivf is a sum of cell currents of n memory cells in the write state (stored data "0"), and thus, distributes to follow a distribution curve 200vn of a current that is n times as large as the cell current in the write state (stored data "0").

On the other hand, FIG. 21B shows a distribution of the verify current occurring in the erase verify operation on the twin cell 12 in the erase state. As described with reference to FIG. 19, in the twin cell 12 in the erase state, in the erase verify period Td, the cell current of one memory cell of the memory cells 10x and 10y both in the erase state flows as a current IPLs from the power supply line PLs to the sense amplifier SA.

Therefore, the verify current Ivf is a sum of cell currents of n memory cells in the erase state (stored data "1"), and thus, distributes to follow a distribution curve 201vn of a current that is n times as large as the cell current in the erase state (stored data "1").

As a result, a reference current Irefn can be set in a region where the distribution curves 200vn and 201vn do not overlap.

With reference to FIG. 20 again, the sense amplifier SAv compares the voltage Vvf on the power supply line PLs and the voltage Vr at the node Nr to equivalently compare the verify current Ivf and the reference current Irefn (FIGS. 21A and 21B).

From this, the relation "Ivf>Irefn", that is, the relation "Vr>Vvf" in the state of FIG. 21B is established. Thus, the sense amplifier SAv outputs RDTv="1" as the erase verify information indicating that n twin cells are in the erase state, that is, each address (write target unit) corresponding to those n memory cells is in the writable state.

On the other hand, the relation "Ivf<Irefn", that is, the relation "Vr<Vvf" in the state of FIG. 21A is established. Thus, the sense amplifier SAv outputs RDTv="0" as the erase verify information indicating that the n twin cells are in the write state, that is, each address (write target unit) corresponding to those n memory cells is in the unwritable state.

In this manner, according to the non-volatile semiconductor storage device of the complementary readout type according to the first embodiment, the information (erase verify information) indicating whether all (2×n) memory cells included in the n twin memory cells belonging to the certain section (such as write target unit (address)) are in the erase state can be generated without the additional arrangement of the memory cell described in the comparative examples in FIG. 8 and FIG. 11, and so forth. As a result, an increase in size and cost due to the additional arrangement of memory cells can be avoided, and the erase verify information for determining whether each write target unit (address) is in the writable state can be obtained.

Also, as described in FIGS. 21A and 21B, the sum of cell currents in (n) twin cells belonging to the write target unit (address) and the reference current Irefn are compared. As a result, while additional arrangement of the memory cell 10v is not required, it is possible to generate the erase verify information with readout accuracy similar to that in the case of the arrangement of the n memory cells 10v in the second comparative example of FIG. 11.

Figure 27:
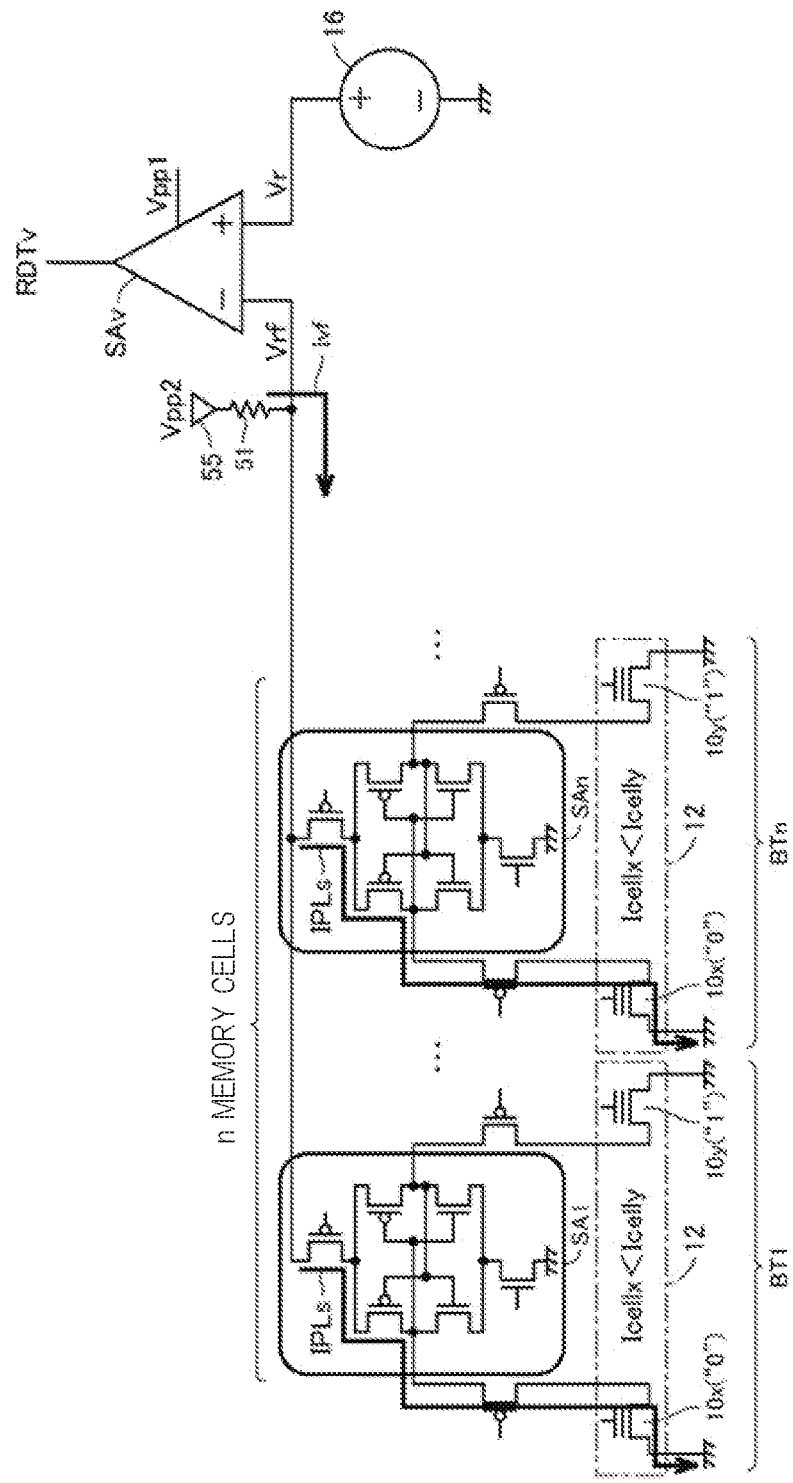
FIG. 27 is a conceptual circuit diagram for describing a non-volatile semiconductor storage device of a complementary readout type according to a modification example of the first embodiment.

As shown in FIG. 27, note that it is also possible to apply a modification example in which a constant voltage source 16 which outputs a voltage equivalent to the voltage Vr in FIG. 20 is arranged to follow a design value of the reference current Irefn without practical generation of the reference current Irefn. In this case, the sense amplifier SAv can generate the above-described erase verify information RDTv by comparing the voltage Vvf on the power supply line PLs and the voltage Vr output from the constant voltage source 16. In this manner, even in the structure without the mechanism for practically generating the reference current Irefn, it is possible to generate the erase verify information RDTv based on the verify current Ivf flowing though the power supply line PLs.

In the first embodiment, the memory cell 10x corresponds to one embodiment of a "first memory cell", the memory cell 10y corresponds to one embodiment of a "second memory cell", "1" of stored data corresponds to one embodiment of a "first level", and "0" corresponds to one embodiment of a "second level". Furthermore, the sense amplifiers SA1 to SAn (sense amplifier SA) each corresponds to one embodiment of a "first amplifier", the sense amplifier SAv corresponds to one embodiment of a "second amplifier", and the power supply line SLp corresponds to one embodiment of a "first power supply line".

In FIG. 16, note that the node Nx corresponds to one embodiment of a "first node" and the node Ny corresponds to one embodiment of a "second node". Also, in the sense amplifier SA, the example in which the amplifying operation of generating the voltage difference with the amplified current difference between the nodes Nx and Ny is performed by the CMOS sense amplifier formed of the transistors 72 to 75 has been described. However, the above-described amplifying operation can be performed also by a sense amplifier with a structure different from that of the CMOS sense amplifier.

Furthermore, in FIG. 15 and FIG. 20, the resistive element 51 corresponds to one embodiment of a "first resistive element", the resistive element 52 corresponds to one embodiment of a "second resistive element", the voltage Vvf corresponds to one embodiment of a "first voltage", and the voltage Vr corresponds to one embodiment of a "second voltage". Also in FIGS. 21A and 21B, the distribution curve 201vn (FIG. 21B) corresponds to one embodiment of a "distribution curve of a current that is n times as large as a first current", and the distribution curve 200vn (FIG. 21A) corresponds to one embodiment of a "distribution curve of a current that is n times as large as a second current".

Second Embodiment

In a second embodiment, an example of circuit structure is described, the circuit structure for suppressing an influence of an additional element due to the erase verify operation on the normal data readout operation of the sense amplifier SA.

Figure 22:
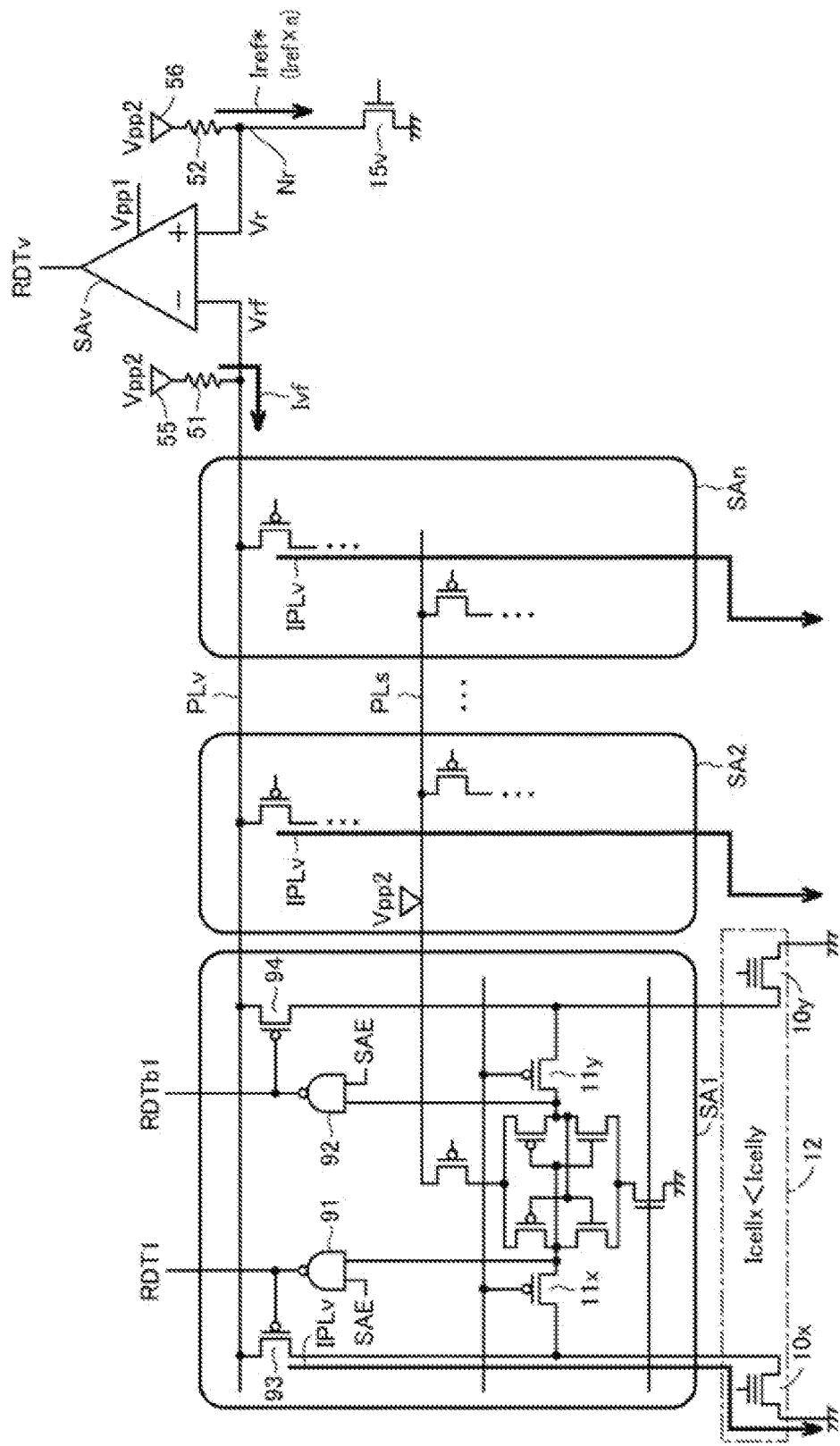
FIG. 22 is a conceptual circuit diagram for describing a structure for generating erase verify information in a non-volatile semiconductor storage device of a complementary readout type according to a second embodiment.

FIG. 22 is a conceptual circuit diagram for describing a structure for generating the erase verify information in the non-volatile semiconductor storage device of the complementary readout type according to the second embodiment.

With reference to FIG. 22, in the second embodiment, separately from the power supply line PLs of the sense amplifiers SA1 to SAn, a power supply line PLv for use in the erase verify operation is arranged. The power supply line PLv is connected to the input node (negative terminal) of the sense amplifier SAv, similarly to the first embodiment (FIG. 15). The resistive element 51 and the power supply node 55 in FIG. 15 are also connected to the power supply line PLv. Furthermore, in the sense amplifiers SA1 to SAn, NAND gates 91 and 92 and P-type transistors 93 and 94 are arranged.

Figure 23:
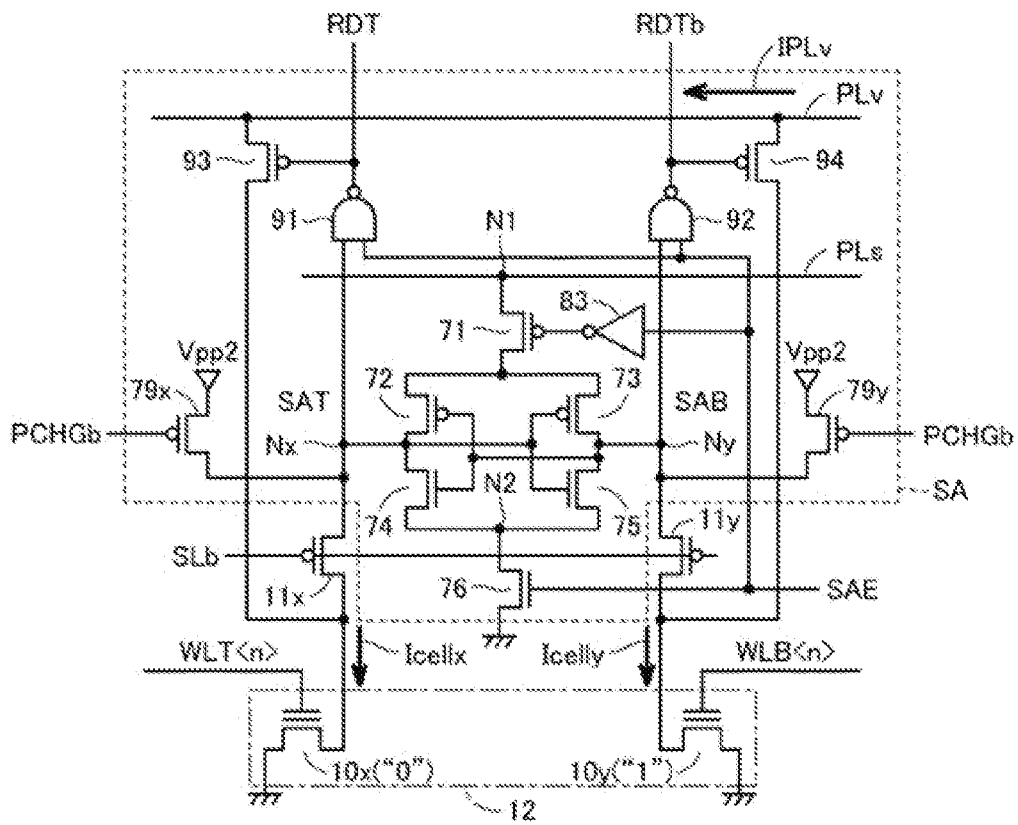
FIG. 23 is a circuit diagram for describing a structure of a sense amplifier shown in FIG. 22.

FIG. 23 is a circuit diagram for describing the structure of each sense amplifier shown in FIG. 22. With reference to FIG. 23, the sense amplifier SA according to second embodiment is different from the structure of the first embodiment shown in FIG. 16 in that the NAND gates 91 and 92 are arranged in place of the inverters 81 and 82 and in that the P-type transistors 93 and 94 are further arranged. The structure of the other portions in FIG. 23 is similar to that in FIG. 16, and its detailed description is not repeated.

As the readout data RDT, the NAND gate 91 outputs a negative logical conjunction (NAND) of the enable signal SAE and the voltage SAT at the node Nx. Similarly, as the inverted readout data RDTb, the NAND gate 92 outputs a negative logical conjunction (NAND) of the enable signal SAE and the voltage SAB at the node Ny.

Therefore, in a period in which the enable signal SAE indicates "0", the readout data RDT and the inverted readout data RDTb are fixed at "1". In a period in which the enable signal SAE indicates "1", the NAND gates 91 and 92 output inverted levels of the voltages SAT and SAB as the readout data RDT and the inverted readout data RDTb, respectively, as similar to the inverters 81 and 82 in FIG. 15.

The transistor 93 is electrically connected between the power supply line PLv and the memory cell 10x without arranging the node Nx and the selector 11x therebetween. To the gate of the transistor 93, an output signal of the NAND gate 91, that is, the readout data RDT is input.

Similarly, the transistor 94 is electrically connected between the power supply line PLv and the memory cell 10y without arranging the node Ny and the selector 11y therebetween. To the gate of the transistor 94, an output signal of the NAND gate 92, that is, the inverted readout data RDTb is input.

Figure 24:
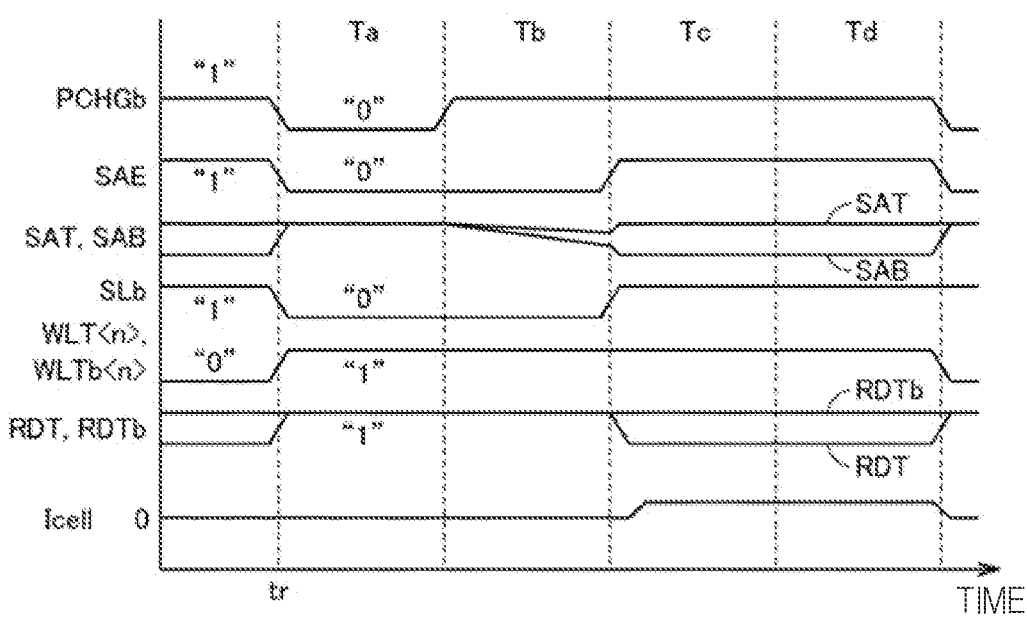
FIG. 24 is an operating waveform diagram of the sense amplifier shown in FIG. 22.

FIG. 24 shows an operating waveform diagram of the sense amplifier SA shown in FIG. 22. In the second embodiment, operations of the sense amplifier SA in the pre-charge period Ta, the sampling period Tb, and the sense period Tc are similar to those in the first embodiment (FIG. 17), except that the readout data RDT and the inverted readout data RDTb in the pre-charge period Ta and the sampling period Tb are set at "1".

That is, in the pre-charge period Ta, each of the nodes Nx and Ny is pre-charged when the transistors 79x and 79y are turned ON, and thus, the voltages SAT and SAB are set at "1". In the second embodiment, since the enable signal SAE input to the NAND gates 91 and 92 indicates "0", the readout data RDT and the inverted readout data RDTb indicate "1". This makes the transistors 93 and 94 maintained OFF.

Furthermore, in the sampling period Tb, a voltage difference depending on a current difference between the cell currents Icellx and Icelly is caused between the nodes Nx and Ny. As similar to FIG. 17, FIG. 24 shows the example with "Icellx<Icelly". Thus, a voltage drop rate of the voltage SAT (node Nx) is smaller than a voltage drop rate of the voltage SAB (node Ny), which results in a relation "SAT>SAB". Also in the sampling period Tb, since the enable signal SAE indicates "0", the readout data RDT and the inverted readout data RDTb indicate "1". This makes the transistors 93 and 94 maintained OFF.

In the sense period Tc, when the selectors 11x and 11y are turned OFF, the voltage difference between the nodes Nx and Ny is amplified by the amplifying operation of the CMOS operational amplifier formed of the transistors 72 to 75 in a state in which the memory cells 10x and 10y are electrically separated from the nodes Nx and Ny. With this, as similar to FIG. 17, in the example of FIG. 24 in which the sense period Tc is started in the state of SAB<SAT, the voltage difference is caused between the nodes Nx and Ny so that the voltage SAT increases to "1" while the voltage SAB decreases to "0".

Then, in the sense period Tc, since the enable signal SAE indicates "1", output signals of the NAND gates 91 and 92 are at an inverted level of the voltages SAT and SAB. Then, one of the transistors 93 and 94 is selectively turned ON in accordance with the output signals from the NAND gates 91 and 92 following the voltages SAT and SAB, respectively.

In the example of FIG. 24, the readout data is set as RDT="0" and the inverted readout data is set as RDTb="1". Thus, while the transistor 93 is turned ON, the transistor 94 is turned OFF. With this, the power supply line PLv and the memory cell 10x are electrically connected, and a current IPLv equivalent to the cell current Icellx of the memory cell 10x occurs on the power supply line PLv.

In the erase verify period Td, as similar to the first embodiment, while the enable signal SAE is maintained at "1", the selection signal SLb is maintained at "1" as different from the first embodiment. As a result, the transistor 93 is maintained to be turned ON, and the current IPLv similar to that in the sense period Tc occurs continuously also in the erase verify period Td.

Figure 25:
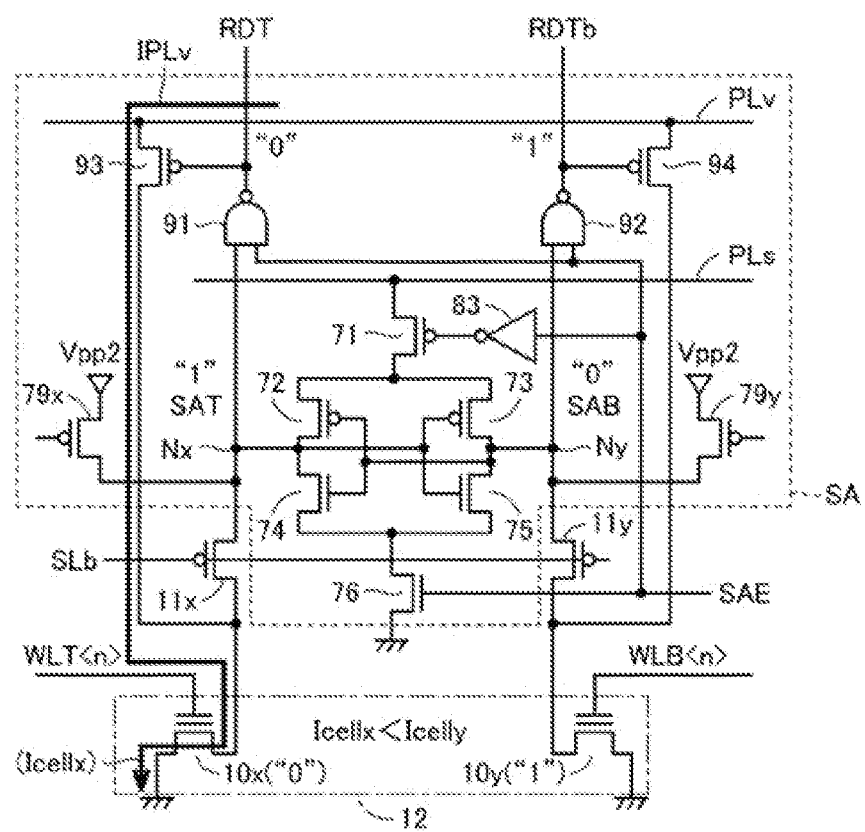
FIG. 25 is a circuit diagram for describing a current path in an erase verify period with respect to a twin cell in the write state in FIG. 23.

FIG. 25 shows a circuit diagram for describing a current path in the erase verify period with respect to the twin cell 12 in the write state. In FIG. 25, the circuit diagram of FIG. 23 is overwritten with a path of the current IPLs occurring in the erase verify period Td.

Also in FIG. 25, as similar to FIG. 18 and FIG. 3A, in the twin cell 12 in the write state, the memory cell 10x is in the write state (stored data "0"), and the memory cell 10y is in the erase state (stored data "1").

At the end of the sense period Tc, the voltage SAT indicates "1" while the voltage SAB indicates "0". Thus, the readout data is set as RDT="0" and the inverted readout data is set as RDTb="1".

Therefore, in the sense period Tc and the erase verify period Td, the transistor 94 is turned OFF while the transistor 93 is turned ON. Thus, the current IPLv equivalent to the cell current in the memory cell 10x in the write state occurs on the power supply line PLv.

Note that, as opposite to the example of FIG. 25, when the memory cell 10x is in the erase state (stored data "1") while the memory cell 10y is in the write state (stored data "0"), in contrast to the above, at the end of the sense period Tc, the voltage difference is caused between the nodes Nx and Ny by the amplifying operation of the CMOS sense amplifier so that the voltage SAB indicates "1" while the voltage SAT indicates "0".

The readout data is set as RDT="1" while the inverted readout data is set as RDTb="0" in accordance with this voltage difference. Also, in the sense period Tc and the erase verify period Td, the transistor 93 is turned OFF while the transistor 94 is turned ON. As a result, the current IPLv equivalent to the cell current Icelly in the memory cell 10y in the write state occurs on the power supply line PLv.

In this manner, also in the second embodiment, in the erase verify period Td, in each sense amplifier SA, the current IPLv equivalent to the cell current of one memory cell having a small cell current of the memory cells 10x and 10y configuring the twin cell 12 occurs on the power supply line PLs.

Figure 26:
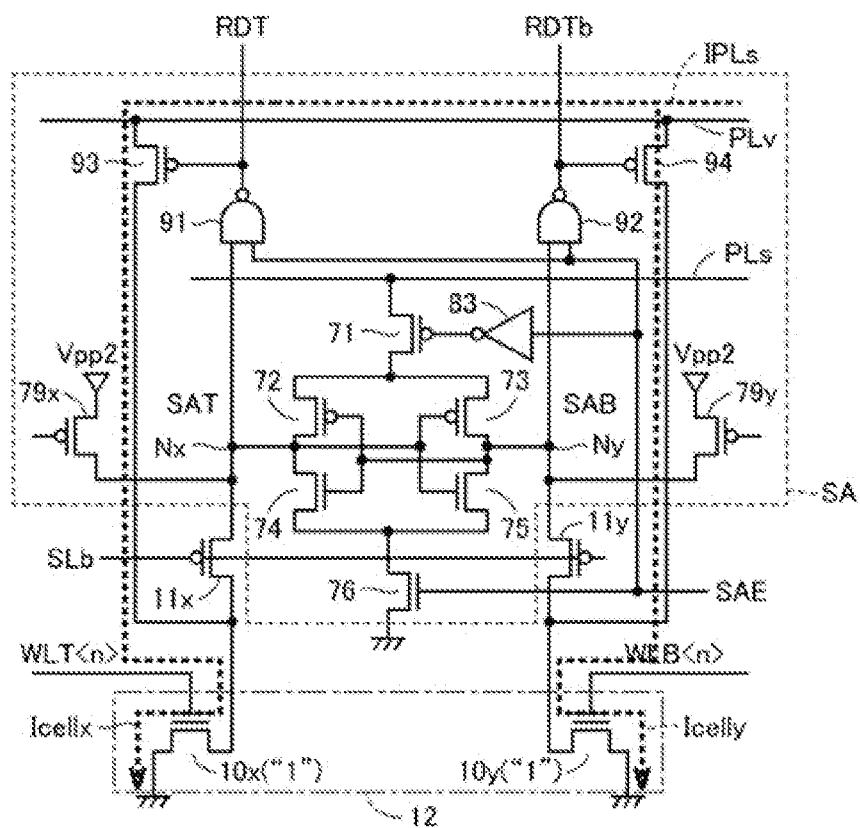
FIG. 26 is a circuit diagram for describing a current path in an erase verify period with respect to a twin cell in the erase state in FIG. 23.

FIG. 26 shows a circuit diagram for describing a current path in the erase verify period with respect to the twin cell in the erase state. Also in FIG. 26, the circuit diagram of FIG. 23 is overwritten with a path of the current IPLv occurring in the erase verify period Td.

In the twin cell 12 in the erase state, the cell currents in the memory cells 10x and 10y are both equivalent to the cell current in the erase state. However, in the sense period Tc, by amplification of the small voltage difference therebetween, one of the voltages SAT and SAB increases to "1" while the other decreases to "0". Also in FIG. 26, it is not determined which one of the voltages SAT and SAB increases to "1".

In the sense period Tc and the erase verify period Td, either one of the transistors 93 and 94 is turned ON. As a result, in accordance with the small cell current difference between the memory cells 10x and 10y both in the erase state, the cell current in one of the memory cells 10x and 10y indicated by dotted lines in FIG. 26 occurs as a current IPLv on the power supply line PLv.

In this manner, in the second embodiment, in each sense amplifier SA, the current IPLv similar to the current IPLs in the first embodiment occurs on the power supply line PLv. That is, in the second embodiment, the power supply line PLv corresponds to one embodiment of the "first power supply line", the power supply line PLs corresponds to one embodiment of the "second power supply line". Also, in the structure of FIG. 23, the transistor 93 corresponds to one embodiment of a "first selection switch", and the transistor 94 corresponds to one embodiment of a "second selection switch".

With reference to FIG. 22 again, in the erase verify operation of the non-volatile semiconductor storage device according to the second embodiment, the pre-charge period Ta, the sampling period Tb, the sense period Tc, and the erase verify period Td of FIG. 24 are sequentially provided. With this, in the erase verify period Td, the above-described current IPLv occurs in the sense amplifiers SA1 to SAn. Thus, in the power supply line PLv as a whole, the verify current Ivf that is the sum of the currents IPLv in the n sense amplifiers SA occurs. As a result, also in the second embodiment, the verify current Ivf similar to that of the first embodiment can be generated.

In this manner, also in the second embodiment, the verify current Ivf similar to that of the first embodiment occurs on a power supply line PLv provided separately from the power supply line PLs. The power supply line PLv is connected to the power supply node 55 through the resistive element 51 as similar to the power supply line PLs in the first embodiment. Thus, a voltage Vvf similar to that of the first embodiment can be generated and input to one input node (negative terminal) of the sense amplifier SAv.

As a result, as similar to the first embodiment, the sense amplifier SAv can output readout data RDTv indicating the erase verify information based on comparison between the verify current Ivf and the reference current Irefn.

Specifically, also in the second embodiment, in the case of "Ivf>Irefn", the sense amplifier SAv outputs RDTv="1" as the erase verify information indicating that the n twin cells are in the erase state, that is, each address (write target unit) corresponding to those n memory cells is in the writable state.

On the other hand, also in the second embodiment, in the case of "Ivf<Irefn", the sense amplifier outputs RDTv="0" as the erase verify information indicating that the n twin cells are in the write state, that is, each address (write target unit) corresponding to those n memory cells is in the unwritable state.

In this manner, also according to the non-volatile semiconductor storage device of the complementary readout type according to the second embodiment, generate the erase verify information can be generated without the additional arrangement of the memory cell, and effects similar to those of the first embodiment can be achieved.

Furthermore, in the non-volatile semiconductor storage device according to the second embodiment, as different from the first embodiment, the erase verify operation can be performed without the connection of the resistive element 51 to the power supply line PLs of the sense amplifier SA. With this, the resistive element 51 is not included in the current path in the sense amplifier SA in the normal data readout operation (the pre-charge period Ta, the sampling period Tb, and the sense period Tc).

In this manner, the readout characteristics of the sense amplifier SA can be prevented from being changed by the electrical resistance value R1 of the resistive element 51, and thus, it is possible to prevent a degradation in the accuracy of the data readout from the twin cell 12 by the sense amplifier SA. That is, the circuit structure according to the second embodiment is suitable when the erase verify operation according to this disclosure is performed by using a sense amplifier SA with severe (strict) characteristics.

In FIG. 23 to FIG. 26, as similar to the first embodiment, the example in which in erase verify operation, the current IPLv equivalent to the cell current of one memory cell having a small cell current of the memory cells 10x and 10y configuring the twin cell 12 occurs on the power supply line PLs is described. However, the second embodiment in which the power supply line PLs for the amplifying operation and the power supply line PLv for the erase verify operation are separately provided can adopt a structure in which the current IPLv at the time of the erase verify operation is equivalent to the cell current of one memory cell having a large cell current of the memory cells 10x and 10y.

Figure 28:
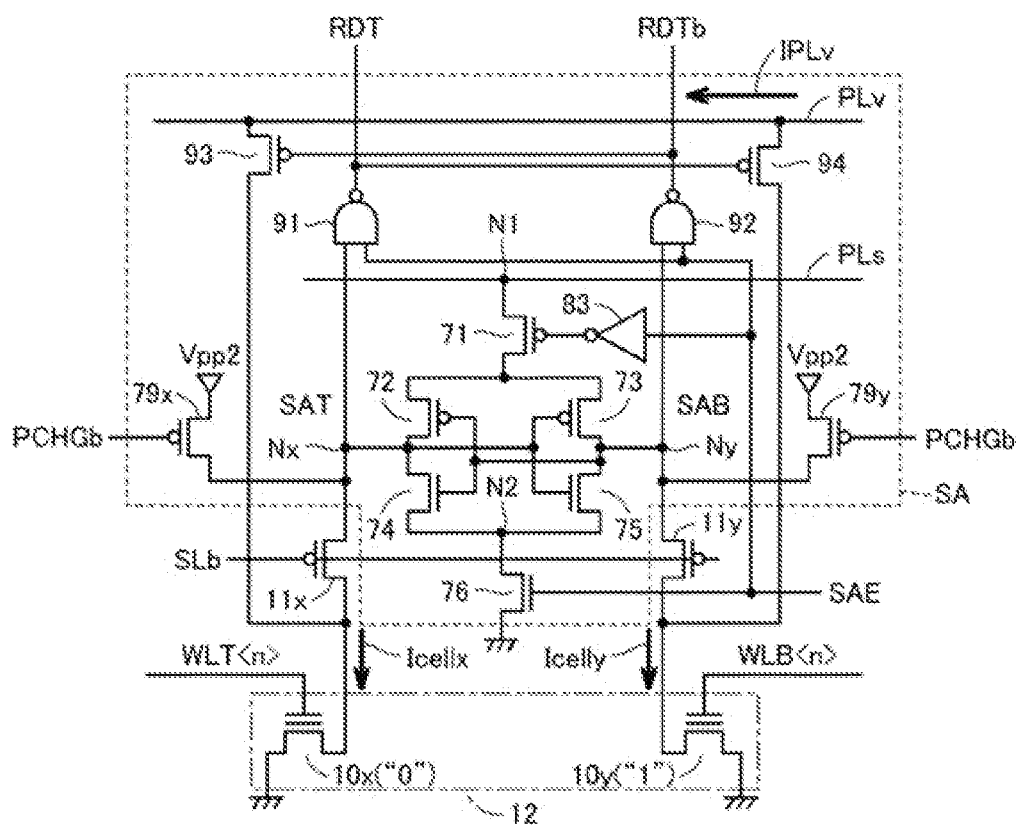
FIG. 28 is a circuit diagram for describing a structure of a sense amplifier in a non-volatile semiconductor storage device of a complementary readout type according to a modification example of the second embodiment.

FIG. 28 shows a circuit diagram for describing the structure of a sense amplifier in a non-volatile semiconductor storage device of a complementary readout type according to a modification example of the second embodiment.

In comparison of FIG. 28 with FIG. 23, in the sense amplifier SA according to the modification example of the second embodiment, connection destinations of the gates of the P-type transistors 93 and 94 are interchanged from those of FIG. 23. That is, an output signal of the NAND gate 92, that is, the inverted readout data RDTb is input to the gate of the transistor 93 while an output signal of the NAND gate 91, that is, the readout data RDT is input to the gate of the transistor 94.

Also for the sense amplifier SA shown in FIG. 28, the operating waveforms of the sense amplifier SA in the pre-charge period Ta, the sampling period Tb, the sense period Tc, and the erase verify period Td are similar to those of FIG. 24. On the other hand, in the modification example of FIG. 28, in comparison with the structure of FIG. 23, in the erase verify period Td, selection as to which one of the transistors 93 and 94 is turned ON is opposite to the structure of FIG. 23.

Figure 29:
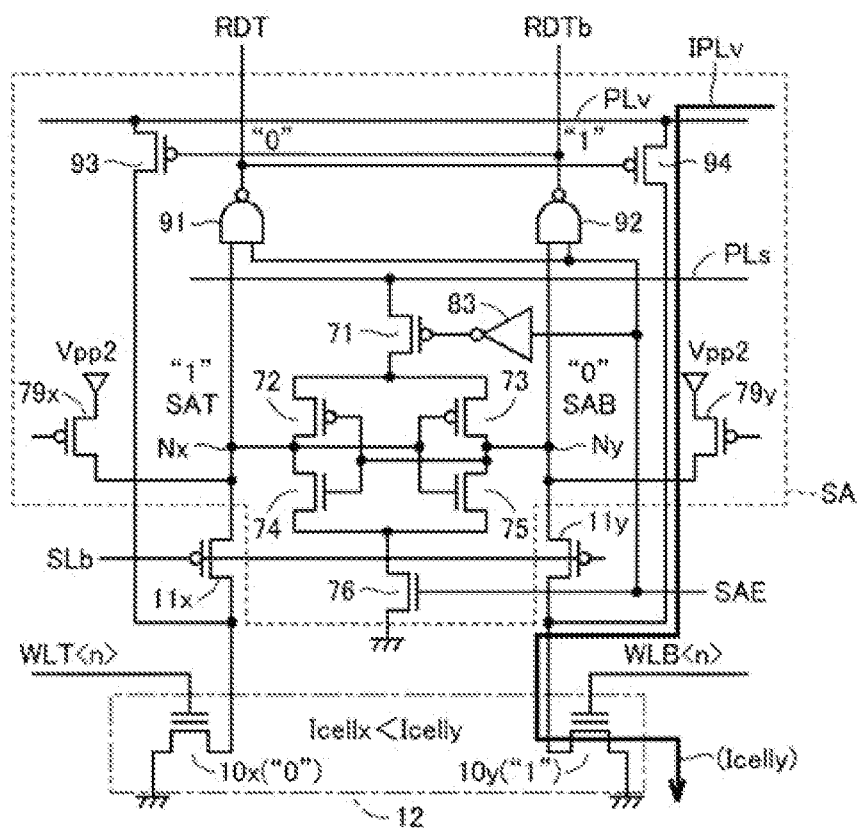
FIG. 29 is a circuit diagram for describing a current path in an erase verify period with respect to the twin cell in FIG. 28.

FIG. 29 shows a circuit diagram for describing a current path in the erase verify period with respect to the twin cell in the write state in FIG. 28.

Also in FIG. 29, at the end of the sense period Tc, as similar to FIG. 25, the readout data is set as RDT="0" while the inverted readout data is set as RDTb="1". However, since the connection destinations of the transistors 93 and 94 are different from those of FIG. 25, the transistor 94 is turned ON while the transistor 93 is turned OFF in FIG. 29. As a result, in contrast to FIG. 25, the current IPLv equivalent to the cell current of the memory cell 10y in the erase state that has a large current occurs on the power supply line PLv.

In the modification example of the second embodiment, in contrast to the example of FIG. 29, when the memory cell 10x is in the erase state (stored data "1") while the memory cell 10y is in the write state (stored data "0"), the voltage difference is caused between the nodes Nx and Ny by the amplifying operation of the CMOS sense amplifier so that the voltage SAB indicates "1" while the voltage SAT indicates "0". As a result, in the erase verify period Td, the transistor 93 is turned OFF while the transistor 94 is turned ON. As a result, it would be understood that the current IPLv equivalent to the cell current Icelly of the memory cell 10y in the erase state that has a large current occurs on the power supply line PLv.

In this manner, in the modification example of the second embodiment, in the erase verify period Td, the current IPLv equivalent to the cell current of one memory cell having the large cell current of the memory cells 10x and 10y configuring the twin cell 12 occurs on the power supply line PLs.

Also in the erase verify operation on the twin cell 12 in the erase state, in accordance with the small cell current difference between the memory cells 10x and 10y both in the erase state, the cell current of one memory cell having the large cell current of the memory cells 10x and 10y occurs as the current IPLv on the power supply line PLv.

Therefore, in the structure of the second embodiment in which the power supply lines PLs and PLv are separately arranged, the erase verify operation can be performed even when either one memory cell having a large cell current or one memory cell having a small cell current of the memory cells 10x and 10y configuring the twin cell 12 is connected to the power supply line PLv to generate the current IPLv. Note that it is previously determined which one of the memory cell having the large cell current and the memory cell having the small cell current is used to generate the current IPLv, based on the connection destinations of the gates of the transistors 93 and 94 described in FIG. 23 and FIG. 28.

Note that FIG. 22 according to the second embodiment can also adopt the modification example in which the voltage Vr output from the constant voltage source 16 as similar to that of FIG. 27 is input to the sense amplifier SAv. That is, in the above-described embodiments, in the sense amplifier SAv, the erase verify information RDTv may be generated regardless of comparison with the reference current Irefn but based on the verify current Ivf flowing through the power supply line PLs (first embodiment) or the power supply line PLv (second embodiment).

Also in the above-described embodiments, the explanation has been made in the state in which the memory cell as the complementary readout target is taken as a flash memory. However, the present disclosure is not limited to the flash memory. Specifically, the present disclosure can be commonly applied to any non-volatile semiconductor storage device of the complementary readout type configured by using a memory cell with its cell current varying depending on which one of "1" or "0" the stored data indicates. Specifically, the present disclosure can be commonly applied to any generation of the erase verify information indicating whether all memory cells included in a twin cell in a certain section are in the erase state, if the write operation is performed from the erase state in which the stored data in the memory cells are identical at one of "0" and "1" to the rewriting of the stored data in one memory cell of the twin cell to the other of "0" and "1".

It is also noted for the confirmatory purpose that, as for the plurality of embodiments described above, appropriate combination of the structures described in the respective embodiments including combinations not mentioned in the specification could have been anticipated in a scope without inconsistency or contradiction at the time of the original filing of the application.

In the foregoing, the invention made by the present inventors has been concretely described on the basis of the embodiments. However, it is needless to say that the present invention is not limited to the foregoing embodiments, and various modifications and alterations can be made within the scope of the present invention.

What is claimed is:

1. A non-volatile semiconductor storage device comprising a plurality of twin cells divided into a plurality of sections,
    wherein each of the plurality of twin cells includes:
        first and second memory cells with a cell current passing in a data readout state varied in accordance with binary stored data,
    wherein each of the twin cells is in either an erase state in which the stored data is identical or a write state in which the stored data is different between the first and second memory cells,
    wherein each of the plurality of sections includes n (n: an integer equal to or larger than 2) twin cells,
    wherein the non-volatile semiconductor storage device further includes:
        n first amplifiers connected to the n twin cells in parallel;
        a second amplifier generating erase verify information indicating whether all the n twin cells are in the erase state; and
        a first power supply line,
    wherein, in erase verify operation, each of the n first amplifiers forms a current path between the first power supply line and one preset memory cell having the cell current that is small or large of the first and second memory cells in the data readout state, and
    wherein, in the erase verify operation, the second amplifier generates the erase verify information based on a current flowing through the first power supply line.

2. The non-volatile semiconductor storage device according to claim 1,
    wherein the second amplifier generates the erase verify information in accordance with a result of comparison between a current flowing through the first power supply line and a preset reference current,
    wherein the stored data has a first level and a second level,
    wherein the first and second memory cells of the twin cell in the erase state store the first level while the first and second memory cells of the twin cell in the write state store one of the first level and the second level and the other, respectively, and
    wherein the reference current is set at a current value between a distribution curve of a current that is n times as large as a first current which is the cell current when each of the first and second memory cells holds the first level, and a distribution curve of a current that is n times as large as a second current which is the cell current when each of the first and second memory cells holds the second level.

3. The non-volatile semiconductor storage device according to claim 2,
    wherein the second amplifier generates the erase verify information based on the result of comparison between a first voltage varying depending on a voltage drop occurring at a first resistive element connected between the first power supply line and a power supply node and a second voltage varying depending on a voltage drop occurring at a second resistive element where the reference current passes.

4. The non-volatile semiconductor storage device according to claim 1,
    wherein the second amplifier generates the erase verify information based on a first voltage varying depending on a voltage drop occurring at a first resistive element connected between the first power supply line and a power supply node.

5. The non-volatile semiconductor storage device according to claim 1,
    wherein the one memory cell is a memory cell having a small cell current of the first and second memory cells,
    wherein each of the n first amplifiers includes
        a sense amplifier which performs an amplifying operation of selectively connecting the first power supply line and one of a first node connected to the first memory cell and a second node connected to the second memory cell, in accordance with comparison in magnitude between a current flowing through the first node and a current flowing through the second node, and
    wherein, in the erase verify operation, the first amplifier forms a current path between the one memory cell and the first power supply line by using a current path formed in the sense amplifier in accordance with a voltage difference between the first node and the second node caused by the amplifying operation.

6. The non-volatile semiconductor storage device according to claim 1, further comprising
    a second power supply line provided separately from the first power supply line,
    wherein the one memory cell is a memory cell having a small cell current or a memory cell having a large cell current of the first and second memory cells,
    wherein each of the n first amplifiers includes:
        a sense amplifier performing an amplifying operation of selectively connecting the second power supply line and one of a first node connected to the first memory cell and a second node connected to the second memory cell, in accordance with comparison in magnitude between a current flowing through the first node and a current flowing through the second node;
        a first selection switch electrically connected between the first power supply line and the first memory cell; and
        a second selection switch electrically connected between the first power supply line and the second memory cell, and
    wherein, in the erase verify operation, one of the first selection switch and the second selection switch is selectively turned ON so that the one memory cell and the first power supply line are electrically connected to each other, in accordance with a voltage difference between the first node and the second node caused by the amplifying operation.

7. The non-volatile semiconductor storage device according to claim 5,
    wherein the sense amplifier is made of a CMOS sense amplifier.

8. The non-volatile semiconductor storage device according to claim 1,
    wherein each of the plurality of sections is equivalent to a write target unit of data, and wherein the erase verify information indicates whether the write target unit is in a writable state.

9. The non-volatile semiconductor storage device according to claim 8,
wherein each of the plurality of sections is identified by an address, and
wherein a bit number of data stored in the address is the n.

10. The non-volatile semiconductor storage device according to claim 1,
wherein the stored data has a first level and a second level,
wherein the first and second memory cells of the twin cell in the erase state store the first level while the first and second memory cells of the twin cell in the write state store one of the first level and the second level and the other, respectively, and
wherein each of the first memory cell and the second memory cell is made of a field effect transistor in which a threshold voltage at which the stored data at the first level is held is lower than a threshold voltage at which the stored data at the second level is held.

11. The non-volatile semiconductor storage device according to claim 1,
wherein the non-volatile semiconductor storage device is a flash memory.

* * * * *